United States Patent [19]

Nakai et al.

[11] Patent Number: 5,371,702
[45] Date of Patent: Dec. 6, 1994

[54] BLOCK ERASABLE NONVOLATILE MEMORY DEVICE

[75] Inventors: Hiroto Nakai, Yokohama; Hideo Kato, Kawasaki; Kaoru Tokushige, Yokohama; Masamichi Asano, Tokyo; Kazuhisa Kanazawa, Kawasaki; Toshio Yamamura, Yokohama, all of Japan

[73] Assignee: Kabushiki Kaisha Toshiba, Kawasaki, Japan

[21] Appl. No.: 27,489

[22] Filed: Mar. 5, 1993

[30] Foreign Application Priority Data

Mar. 5, 1992 [JP] Japan .................................. 4-048338
Oct. 20, 1992 [JP] Japan .................................. 4-281193

[51] Int. Cl.$^5$ .......................... G11C 11/34; G11C 7/00
[52] U.S. Cl. .................... 365/185; 365/218; 365/230.03; 365/230.08
[58] Field of Search ............ 365/900, 218, 185, 230.3, 365/230.8, 230.03, 230.08

[56] References Cited

U.S. PATENT DOCUMENTS

| | | | |
|---|---|---|---|
| 5,043,942 | 8/1991 | Iwata .......................... | 365/185 |
| 5,050,125 | 9/1991 | Momodomi .................. | 365/185 |
| 5,065,364 | 11/1991 | Atwood ...................... | 365/218 X |
| 5,241,510 | 8/1993 | Kobayashi .................. | 365/230.03 X |

FOREIGN PATENT DOCUMENTS 1298600 12/1989 Japan .................................. 365/218
2-292798 4/1990 Japan .

Primary Examiner—Eugene R. LaRoche
Assistant Examiner—Son Mai
Attorney, Agent, or Firm—Foley & Lardner

[57] ABSTRACT

In response to a plurality of address signal input from the outside in sequence, an erase information inputting section controls an erase information holding section corresponding to the batch erase block to be erased so as to hold an erase information data. By repeating this operation in sequence, the erase information data are stored in the erase information holding sections corresponding to the plural batch erase blocks to be erased. Successively, on the basis of the erase information data stored in the erase information holding sections, block erasing sections are activated to erase all the nonvolatile memory cells of each of the corresponding blocks where the erase information data are held. As a result, the erasure operation is achieved for all the batch erase blocks corresponding to the erase information holding sections in each of which the erase information data is held, so that a plurality of batch erase blocks can be erased simultaneously, thus reducing the erasure time, as compared with the prior art memory device.

13 Claims, 21 Drawing Sheets

FIG. 11

|  | READ OUT | WRITE | CHIP ERASE | BLOCK ERASE |
|---|---|---|---|---|
| SIGNAL A | $V_{CC}$ | $V_{CC}$ | GND | GND |
| SIGNAL B | GND | GND | $V_{CC}$ | $V_{CC}$ |
| SIGNAL C | GND | GND | $V_{PP}$ | $V_{PP}$ |
| SIGNAL D | $V_{CC}$ | GND | GND | GND |
| SIGNAL E | GND | $V_{CC}$ | GND | GND |
| POWER SOURCE $V_A$ | $V_{CC}$ | $V_{PP}$ | $V_{PP}$ | $V_{PP}$ |
| POWER SOURCE $V_B$ | $V_{CC}$ | $V_{PI}$ | $V_{CC}$ | $V_{CC}$ |
| POWER SOURCE $V_C$ | $V_{CC}$ | $V_{CC}$ | $V_{PP}$ | $V_{PP}$ |

FIG. 12

| | | READ OUT | WRITE | CHIP ERASE | BLOCK ERASE |
|---|---|---|---|---|---|
| SELECTED DECODER 203₁ (SELECTED NAND BUNDLE) | SELECTED GATE (DRAIN) | $V_{CC}$ | $V_{PI}$ | $V_{PP}-V_{thN}$ | $V_{PP}-V_{thN}$ |
| | CONTROL GATE 0 | GND | $V_{PP}$ | GND | GND |
| | CONTROL GATE 1~7 | $V_{CC}$ | $V_{PI}$ | GND | GND |
| | SELECT GATE (SOURCE) | $V_{CC}-V_{thN}$ | GND | $V_{PP}-V_{thN}$ | $V_{PP}-V_{thN}$ |
| NON SELECTED DECODER 203₁~203₂₅₆ (NON SELECTED NAND BUNDLE) | SELECT GATE (DRAIN) | GND | GND | $V_{PP}-V_{thN}$ | $V_{PP}-V_{thN}$ |
| | CONTROL GATE 0 | GND | GND | GND | $V_{PP}$ |
| | CONTROL GATE 1~7 | GND | GND | GND | $V_{PP}$ |
| | SELECT GATE (SOURCE) | GND | GND | $V_{PP}-V_{thN}$ | $V_{PP}-V_{thN}$ |
| C G | CG 0 | GND | $V_{PP}$ | GND | $V_{PP}$ |
| | CG 1~7 | $V_{CC}$ | $V_{PI}$ | GND | $V_{PP}$ |

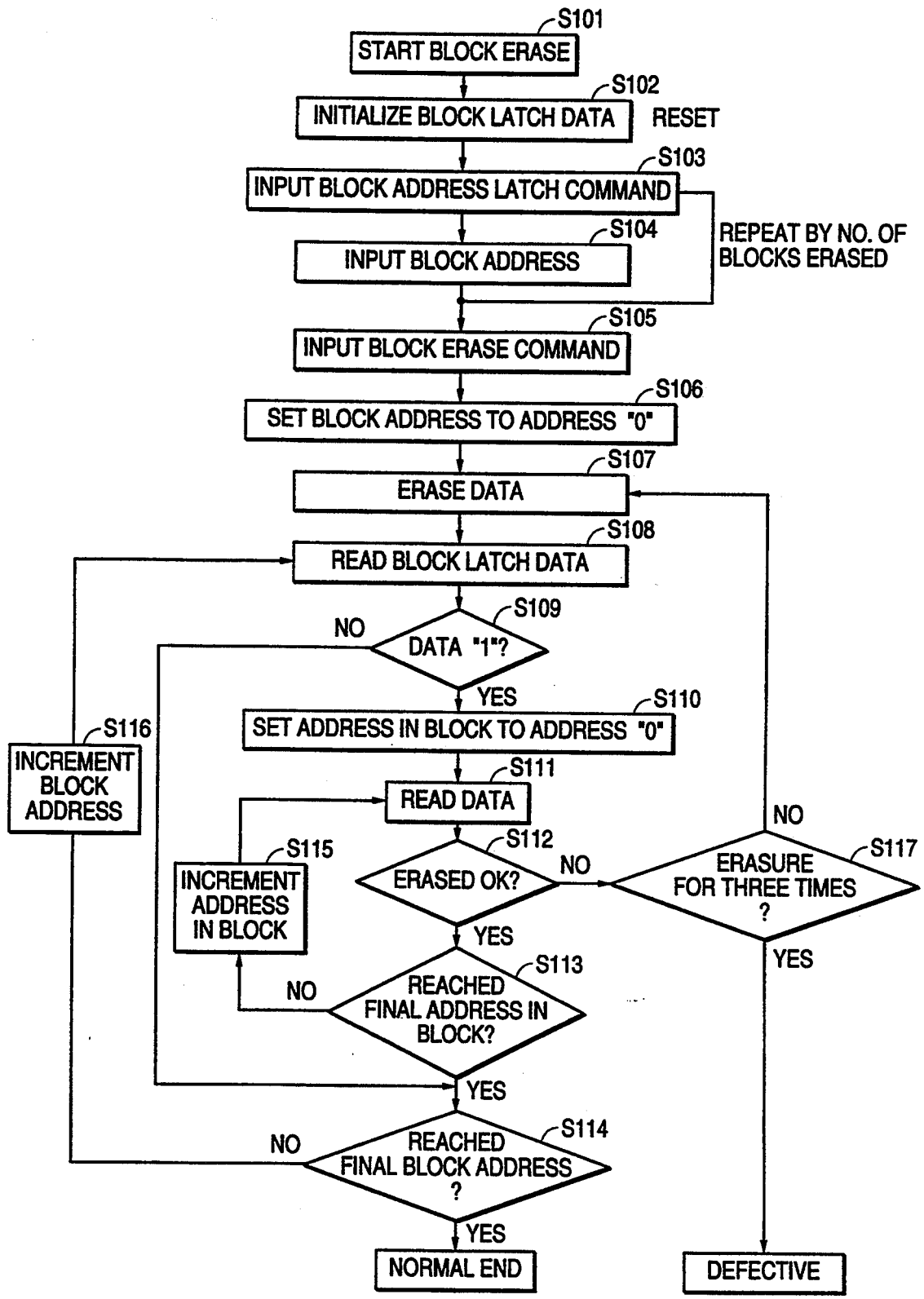

FIG. 25
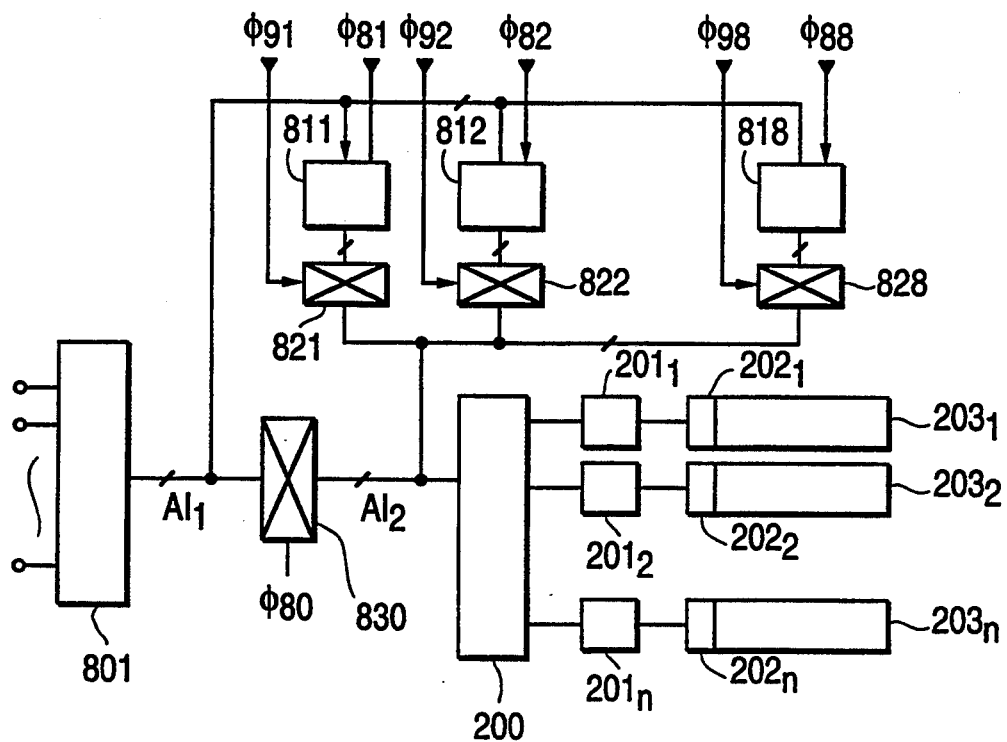
FIG. 26A
FIG. 26B
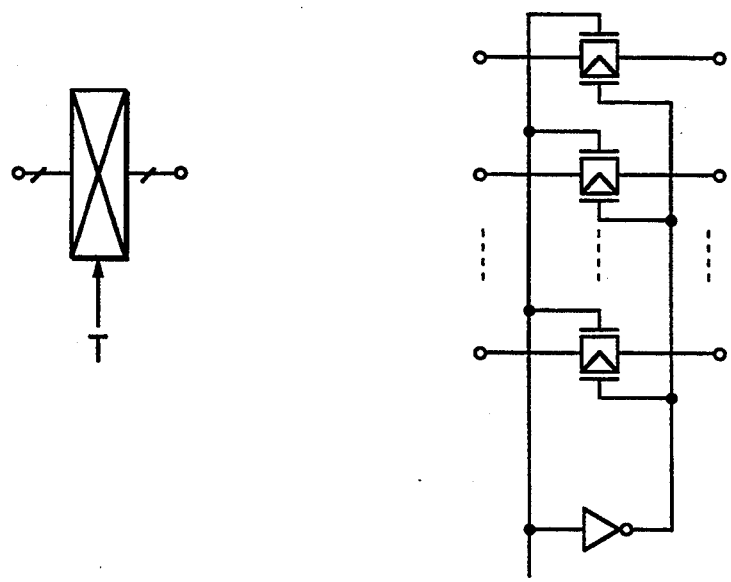

BLOCK ERASABLE NONVOLATILE MEMORY DEVICE

BACKGROUND OF THE INVENTION

1. Field of the Invention

The present invention relates to a nonvolatile semiconductor memory device, and more specifically to an EEPROM (electrically erasable programmable ROM) provided with a plurality of batch erase blocks each composed of a plurality of nonvolatile memory cells erasable simultaneously.

2. Description of the Prior Art

A batch erase EEPROM by which the size of memory cells can be reduced has been developed. The batch erase type EEPROM can be classified into a chip erase type (all the memory cells in a semiconductor memory device are erased simultaneously) and a block erase type (the memory cell array is divided into a plurality of blocks and the memory cells are erased in the unit of block independently and simultaneously). The latter block erase type, in particular has such an advantage as to cope with written data of various volumes, there exists an expectation as the usage of substitute for a magnetic disk drive.

FIG. 1 shows a conventional block erase type EEPROM. The EEPROM includes a plurality of batch erase blocks $1000_i$ (i=1 to n) composed of nonvolatile memory cells always erasable simultaneously, a plurality of row subdecoders $1001_i$ (i=1 to n) provided for each batch erase block, for selecting cells to be read from among memory cells of each batch erase block 1000, a row main decoder 1002 for selecting one batch erase block from among the plural batch erase blocks 1000 on the basis of an internal address AI, and an address latch circuit 1003 for latching an external address AE input from the outside and generating an internal address AI. The row subdecoder $1001_i$ functions as means for erasing the corresponding block.

In the configuration as described above, when the first batch erase block $1000_1$ and the second batch erase block $1000_2$ are required to be erased in the block erase operation for instance, the erase operation must be made in a predetermined sequence; that is, the batch erase block $1000_1$ is first erased by inputting a block address corresponding to the batch erase block $1000_1$ from the outside, and then the batch erase block $1000_2$ is erased by inputting a block address corresponding to the batch erase block $1000_2$ from the outside.

As described above, since the row main decoder 1002 can select only signal erase block at a time, it has been necessary to repeat the same erase operation when a plurality of batch erase blocks are required to be erased. Consequently, there exists a problem in that it takes a long time in order to erase a great number of batch erase blocks. For instance, when n-piece blocks are erased, if the time required for one erasure is 10 msec, n×10 msec is necessary. Therefore, in the conventional block erase type device, the erasure time increases with increasing number of the batch erase blocks to be erased. This problem is not involved in the chip batch erase type EEPROM.

As described above, in the conventional nonvolatile semiconductor memory device, there exists a problem in that the erasure time is long when a plurality of blocks are erased, as compared with the case where the all bits are erased simultaneously.

Furthermore, as an improved technique for erasing blocks effectively, a flash EEPROM system invented by Eliyshou HARARI et al. is disclosed in Japanese Patent Laid-open No. 2-292798 (Dec. 4, 1990) which corresponds to EPC-A2-398,895 published on Oct. 17, 1990.

In this system, a memory cell array is divided into sectors in the bit line direction in the unit of simultaneous erasure, and the simultaneous erasure is facilitated by selecting one or more sectors. In this system, however, since a select signal is simply applied to a decoder for selecting the sectors, there still exists a problem in that the total erasure time is not necessarily reduced.

SUMMARY OF THE INVENTION

Accordingly, the object of the present invention is to provide a nonvolatile semiconductor memory device provided with a plurality of batch erase blocks, simple in configuration and short in erasure time.

According to the present invention, there is provided a nonvolatile semiconductor memory device, comprising:

a plurality of batch erase blocks each composed of a plurality of nonvolatile memory cells erasable simultaneously;

a plurality of erase information holding means provided for each of the batch erase blocks, for holding erase information of each of said batch erase blocks;

erase information inputting means for allowing the erase information to be held by said erase information holding means in sequence; and a plurality of erasing means provided for each of said batch erase blocks, for applying an erase voltage to a control electrode of each of all the nonvolatile memory cells of the corresponding batch erase block, when the erase information is held by said corresponding erase information holding means in erasure operation.

According to the present invention, in response to a plurality of address signals input from the outside in sequence, erase information inputting means controls an erase information holding means corresponding to the batch erase block to be erased so as to hold an erase information data. By repeating this operation in sequence, the erase information data are stored in the erase information holding means corresponding to the plural batch erase blocks to be erased. Successively, on the basis of the erase information data stored in the erase information holding means, block erasing means are activated to erase all the nonvolatile memory cells of each of the corresponding blocks where the erase information data are held. As a result, the erasure operation is achieved for all the batch erase blocks corresponding to the erase information holding means in each of which the erase information data is held, so that a plurality of batch erase blocks can be erased simultaneously, thus reducing the erasure time, as compared with the conventional memory device.

Further, verify operation is executed to check whether the nonvolatile memory cells in the batch erase block have been erased sufficiently after the erasure operation. That is, when block selecting means selects the batch erase blocks whose erase information data are held by the corresponding erase information holding means, since erase information holding signal outputting means outputs an erase information holding signal, it is possible to discriminate whether the batch erase blocks are erased on the basis of the erase information holding signals. On the basis of the signals, since the verify operation is made for only the blocks whose erase information data are held, it is possible to complete the block erasure at a short verify time, without reading all the data of all the memory cells, thus reducing the erasure time including the verify time.

Further, in the read operation, since the erase information holding means transmits block select signals to the corresponding batch erase blocks, it is possible to use partially in common a block selecting decoder for erasure and the data reading decoder, thus reducing the chip area by an area required for the block selecting decoder.

Further, there are provided erase information inputting means for allowing the erase information data to be held by a plurality of erase information holding means corresponding to the batch erase blocks designated by an address signal and the adjoining batch erase blocks designated by a block number signal. Therefore, when a plurality of block addresses are input (in particular, when three or more blocks are erased simultaneously), only two signals are input, without inputting all the address signals corresponding to all the batch erase blocks to be erased.

BRIEF DESCRIPTION OF THE DRAWINGS

In the attached drawings:

FIG. 11 is a table listing signals and voltages of the first embodiment of the present invention;

FIG. 12 is a table listing the operation states of the first embodiment of the present invention;

FIG. 13 is a flowchart for explaining the block erase operation according to the first embodiment of the present invention;

FIG. 25 is a circuit diagram showing a seventh embodiment of the present invention;

FIGS. 26A and 26B are circuit diagrams showing a seventh embodiment of the present invention;

DETAILED DESCRIPTION OF THE PREFERRED EMBODIMENTS

A first embodiment of the present invention will be described hereinbelow with reference to FIGS. 2 to 14, which is an example of the nonvolatile semiconductor memory device of the present invention applied to an NAND EEPROM.

Figure 1:
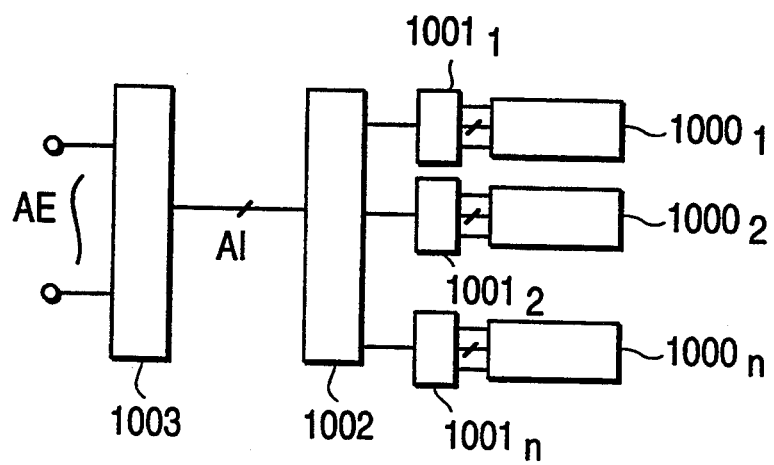
FIG. 1 is a block diagram showing a conventional nonvolatile semiconductor memory device of block erasable type.
Figure 2:
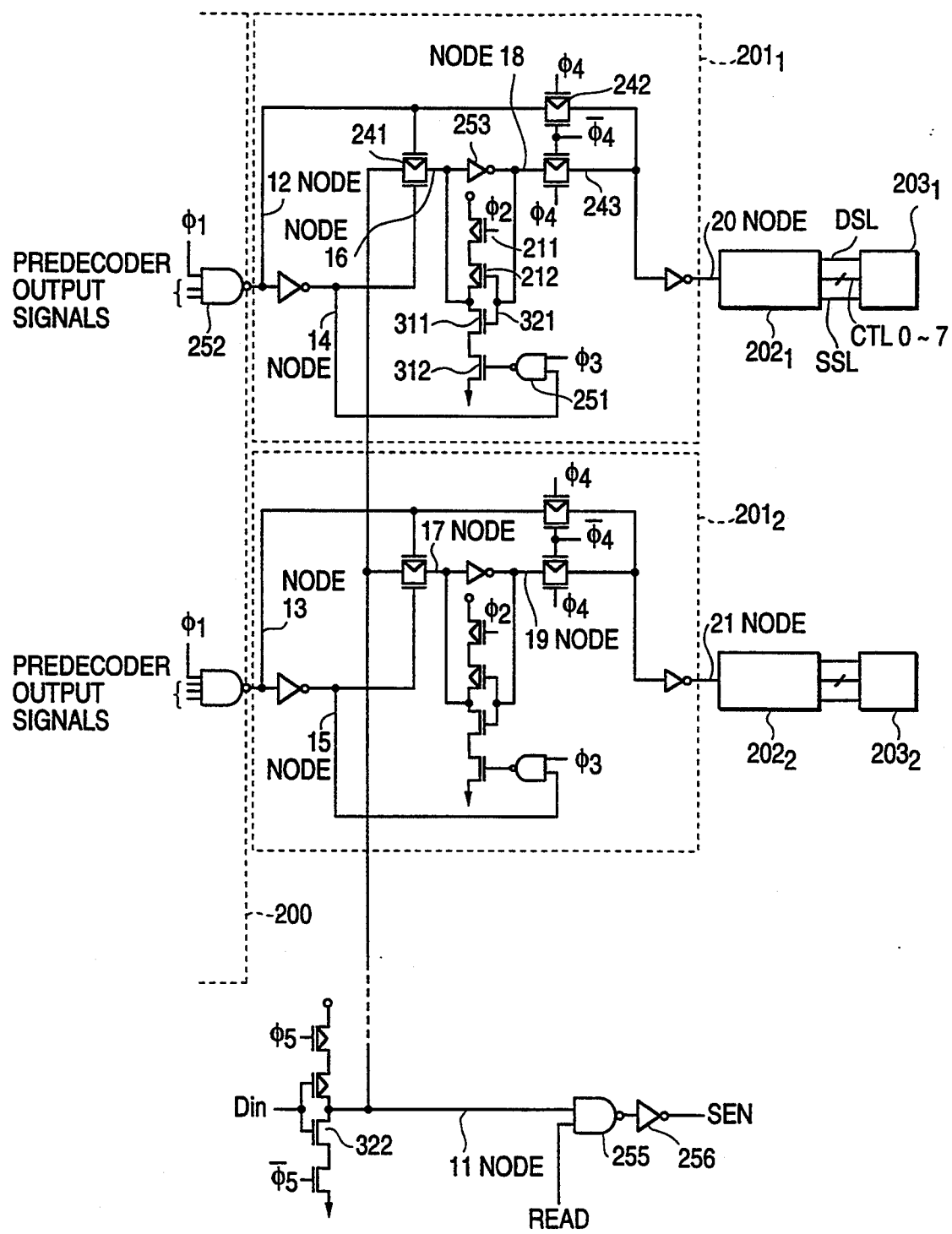
FIG. 2 is a circuit diagram showing a first embodiment of the nonvolatile semiconductor memory device according to the present invention.

FIG. 2 is circuit diagram of a row decoder and the other circuits related thereto of the nonvolatile semiconductor memory device according to the present invention. The circuit comprises a row main decoder 200 functioning as erase information inputting means or block selecting means, latch circuits 201 connected to the output stage of the row main decoder 200, respectively and functioning as erase information holding means, and row subdecoders 202 connected to the latch circuits 201, respectively and functioning as block erasing means. Further, each of the batch erase blocks 203 activated by the row subdecoders 202, respectively is composed of NAND memory cells arranged.

Figure 3:
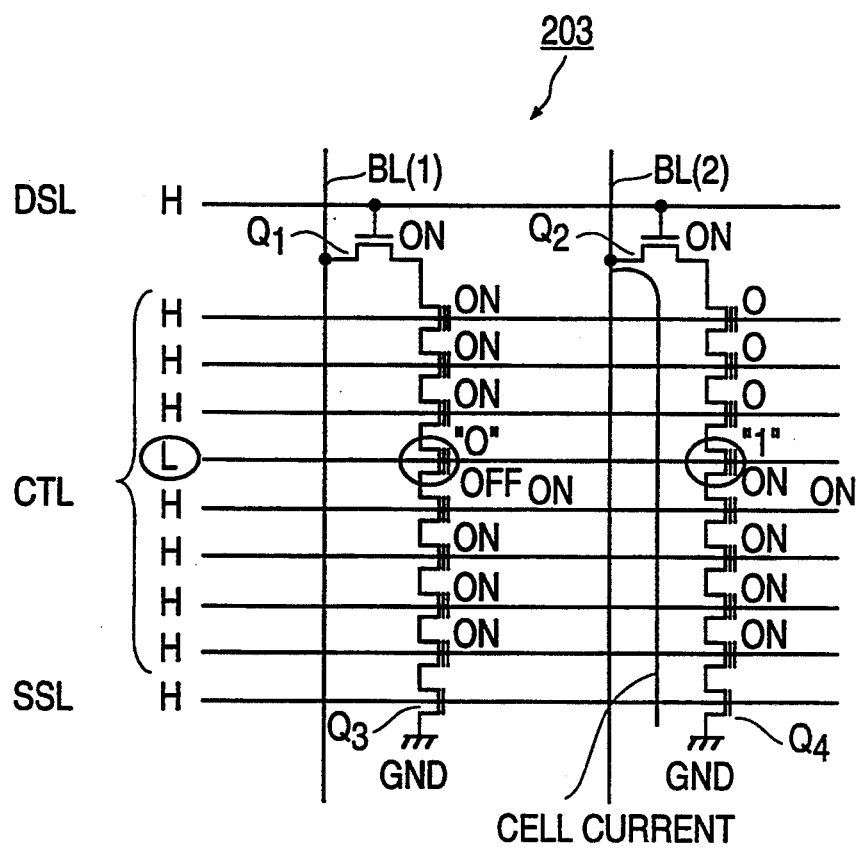
FIG. 3 is a circuit diagram showing a more detailed configuration of the batch erase block shown in FIG. 2 together with voltages applied in data read operation.
Figure 4:
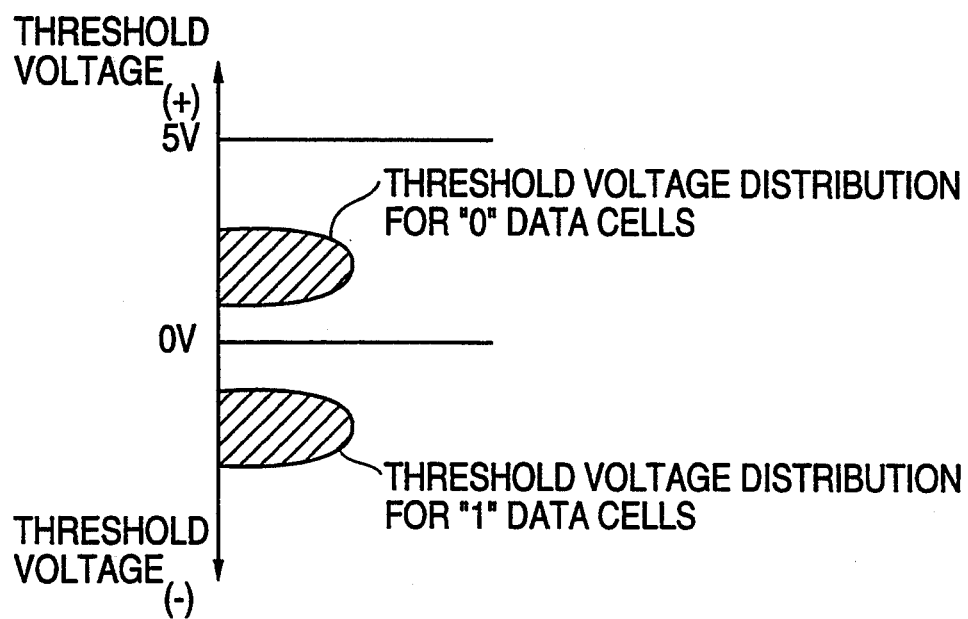
FIG. 4 is a graphical representation showing threshold distributions of ordinary memory cells.
Figure 5:
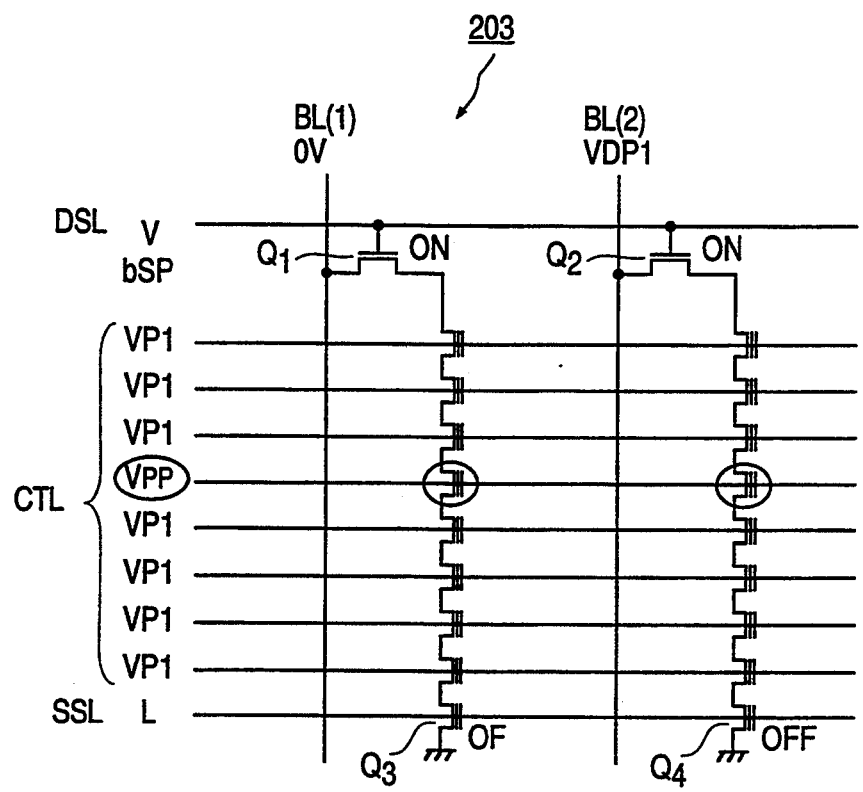
FIG. 5 is a circuit diagram showing voltages applied to a batch erase block in data write operation.

First, the configuration and the operation of the batch erase block 203 will be described with reference to FIGS. 3 to 8. FIGS. 3, 5 and 7 show the configuration of the batch erase block 203 including two NAND bundles each composed of series-connected 8 memory cells having floating gate structure, control gates thereof are connected respective control lines CTL. The drain side of each bundle of the memory cells is connected to a bit line BL1 or 2 via a MOS transistor Q1 or Q2 which is controlled by a drain side select line DSL and the source side of each bundle of the memory cells is connected to a source via a MOS transistor Q3 or Q4 which is controlled by a source side select line SSL.

In data reading, as shown in FIG. 3, a control line CTL of the selected memory cell is set to a low level, for instance 0 V (referred to as "L", hereinafter), and control lines CTL of the remaining 7 memory cells of the NAND group are set to a high level, for instance 5 V (referred to as "H", hereinafter). Further, a drain side select line DSL is connected to the gates of the select transistors Q1 and Q2 each arranged between the bit line and the NAND bundle, and a source side select line SSL is connected to the gates of the select transistors Q3 and Q4 each arranged between the ground GND and the NAND bundle. These select lines DSL and SSL are both set to "H". As shown in FIG. 4, the threshold voltage of the written memory cell distributes as positive values, and the electron injection rate to the memory cell is so controlled that the threshold voltage of the write line becomes lower than the gate voltage ("H") of the non-selected transistors of the NAND bundle. Accordingly, when the threshold voltage of the selected memory cell is positive, no current flows between the bit line BL and the GND so that the bit line is at "H". In contrast with this, when the threshold voltage of the selected memory cell is negative, current flows between the bit line BL and the GND so that the bit line is at "L". A data in the memory cell can be read by sensing the potential of the bit line.

The data writing operation will be described hereinbelow. As shown in FIG. 5, a high voltage (Vpp) of about 20 V is supplied from the row decoder to the control line of the selected memory cell, and an intermediate voltage (VP1) of about 10 V is supplied to the control lines of the remaining memory cells of the same NAND bundle. Further, although not shown, a voltage of 0 V is supplied to the control lines of the other NAND bundles. In this state, the gate voltage of the select transistor arranged between the bit line and the NAND bundle including the selected memory cells is set to 12 V (Vbsp), and the gate voltage of the select transistor arranged between the NAND bundle and the source is set to 0 V.

Figure 6A:
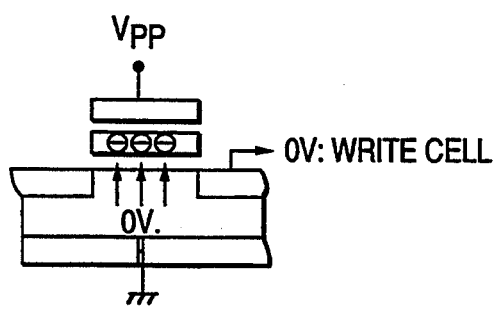
FIGS. 6A and 6B are cross-sectional views showing the behavior of electrons when a data is written and when not written.
Figure 6B:
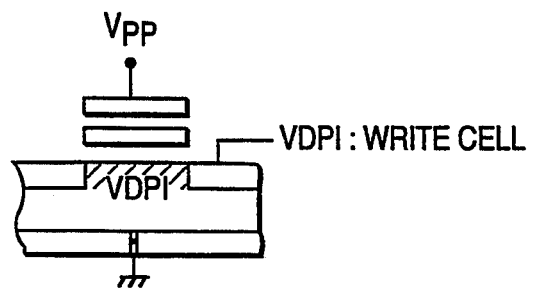
Figure 7:
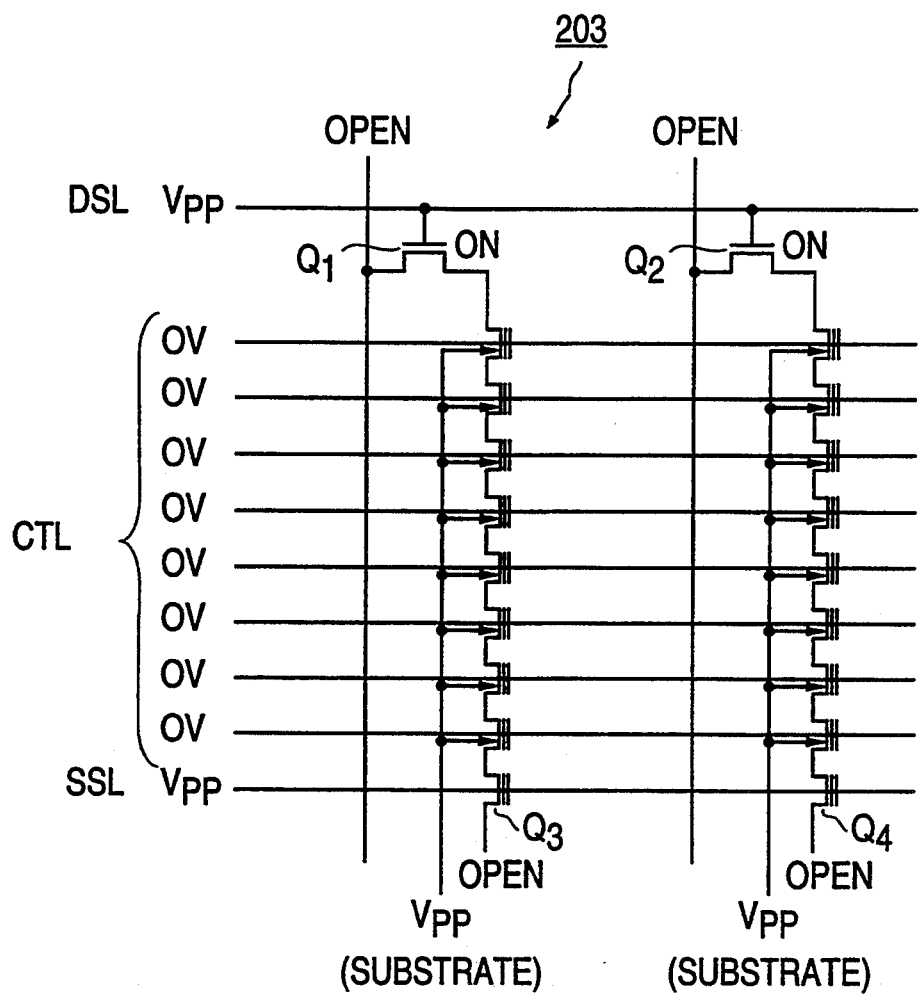
FIG. 7 is a circuit diagram showing voltages applied when a batch erase block is erased.

Under these conditions, when the bit line is set to 0 V, since the potentials of the drains, sources and channels of all the memory cells of the NAND bundle selected by the select transistor are set to 0 V, a potential difference of about 20 V is produced between the control line and the channel of the selected memory cell, so that electrons are injected from the substrate to the floating gate due to tunnel phenomenon as shown in FIG. 6A. In this case, although a potential difference of about 10 V is produced between the control lines and the channels of the remaining seven memory cells of the same NAND bundle, the thickness of the oxide film between the floating gate and the channel is so determined that electrons will not be injected at such a low potential difference as 10 V, so that "0" data are not written in the remaining seven memory cells.

Further, when the bit line is set to a write disable drain voltage (VDPI) of about 10 V, the potential difference between the control line and the channel of the selected memory cell is about 10 V, so that a data is not written as shown in FIG. 8B. At this time, since no potential difference develops between the select gates and the channels of the other seven memory cells of the same NAND bundle, data are not written. As described above, in data writing operation, a voltage of 0 V is applied to the bit line to write a data "0" in the selected memory cell, and a voltage VDPI is applied to the bit line to write a data "1" to the selected memory cell.

Figure 8:
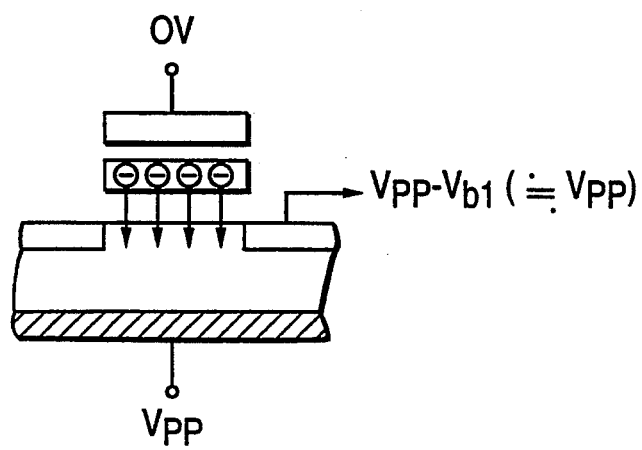
FIG. 8 is a cross-sectional view showing the behavior of electrons when a data is erased.

The erasing operation will be described hereinbelow. As shown in FIGS. 7 and 8. The erasure is made by setting the substrate to 20 V (Vpp) and the control line to 0 V to extract electrons into the substrate. At this time, the select line is set to 20 V (Vpp) to reduce the gate stress of the selected gate. In addition, the bit line and the source line are both opened so as to be set to the potential Vpp to prevent the PN junction of the memory cell array from being biased in the forward direction.

As described above, a tunnel current is used for writing operation of the NAND type EEPROM. Therefore, the current flowing through the bit line is low in writing, so that it is possible to write a data to several thousands of memory cells at the same time.

As described above, in the NAND type EEPROM, it is possible to selectively erase blocks by supplying a voltage of 0 V to all the control lines of the one NAND bundle and by supplying a voltage Vpp to the control lines of the other non-selected NAND bundle. In the case of memory cells of a 4 Mbit NAND type EEPROM, 256 bits (about 2 Kbits) are arranged in the column direction and 256 NAND bundles (each composed of 8 series-connected memory cells and the select gate transistor) are arranged in the row direction so as to form a memory cell matrix of 4 Mbits. When the above-mentioned block erasure is effected for the memory chip as described above, the number of memory cells erased simultaneously is 16384 (16 K) because of $256 \times 8 \times 8$. Since the erasure operation is effected by extracting electrons at the floating gate by an electric field, the erasing time is decided by the Fauler-Nordheim type tunnel current. As a result, the time required to erase one block is equal to that required to erase all the bits, and therefore the erasing time is about 10 msec in the case where the oxide film thickness is 10 nm.

Figure 9:
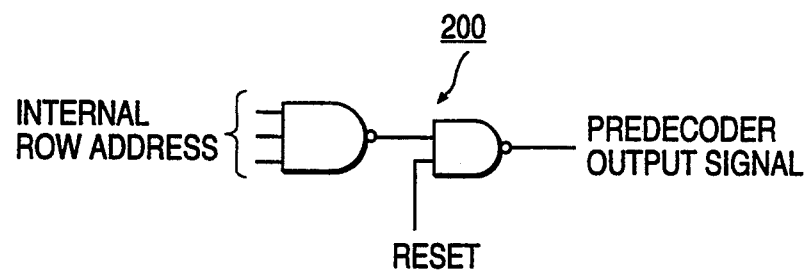
FIG. 9 is a circuit diagram showing a configuration of the row pre-decoder used for the first embodiment of the present invention.

The row main decoder 200 will be described hereinbelow. The row main decoder 200 is a circuit for selecting one batch erase block 203 of the above-mentioned NAND bundles. An address input from the outside is converted into an internal row address by an address latch circuit (not shown), and in response to this internal row address, the row main decoder selects one of the batch erase blocks 203. In the row main decoder 200 as shown in FIG. 9, a predecoder output signal is generated as an output of a NAND gate of two signals (a NAND output of the internal row address signals and a reset signal).

Figure 10:
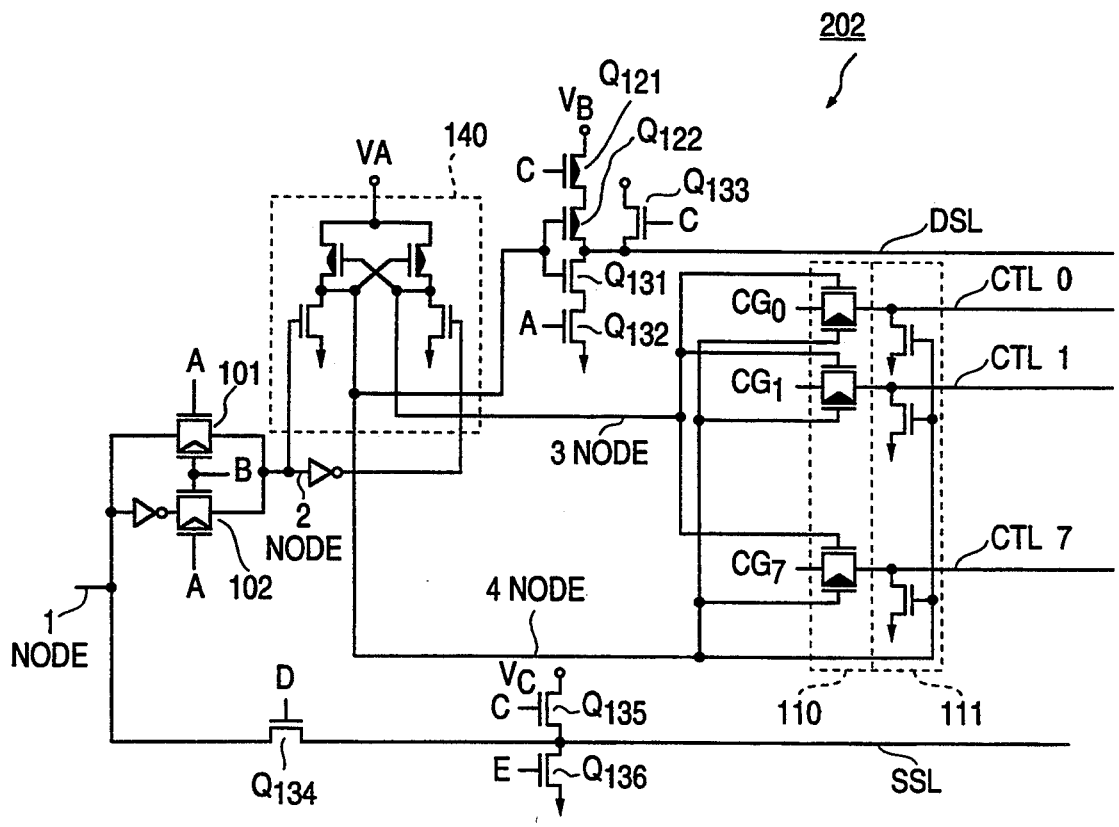
FIG. 10 is a circuit diagram showing a configuration of the row subdecoder used for the first embodiment of the present invention.

The row subdecoder 202 will be described hereinbelow. This row subdecoder 202 functions as erasing means for erasing memory cells of the batch erase block 203 in erasure operation. The number of the row subdecoders 202 is 256, which is the same as the number of the batch erase block 203. The configuration of the row subdecoder 202 is shown in FIG. 10. In data read, write and erase operation, potentials as listed in FIG. 11 are applied as input signals A, B, C, D and E, respectively. Further, voltages also as listed in FIG. 11 are supplied as the supply voltages VA, VB and VC according to the respective modes.

In data read operation, the potential of an input node 1 of the selected row subdecoder 202 is set to 5 v (Vcc), and the potential of an input node of the non-selected row subdecoder 202 is set to 0 V. In reading operation, since the potential of the signal A is controlled so as to change to 5 V and that of the signal B is controlled so as to change to 0 V, a switch 101 composed of a P channel transistor and an N channel transistor is turned on and a switch 102 is turned off.

Accordingly, the potential at the node 2 is the same as that at the node 1. Since the potential of the supply voltage VA in read operation is 5 V, the potential at a node 3 of the row subdecoder section selected by the row main decoder 200 becomes 5 V and the potential at a node 4 becomes 0 V. Further, the potential at the node 3 of the row subdecoder section selected by the non-selected row main decoder section becomes 0 V, and the potential at the node 4 becomes 5 V. As a result, an output gate 110 of the selected row subdecoder is turned on and a discharge N channel transistor array 111 is turned off.

Therefore, as shown in FIG. 12, in the selected row subdecoder, the potential of 0 V of the selected CG0 is outputted to a control line CTL0, and the potential of 5 V (Vcc) of the non-selected CG1 to CG7 is outputted to control lines CTL1 to CTL7, respectively. Further, since the output gates 110 of the non-selected row subdecoder section are turned off and further a discharge transistor array 111 is turned on, the potentials of all the control lines CTL are set to 0 V in the non-selected row subdecoder, irrespective of the potential of CG0 to CG7.

Further, since the potential of the signal C is 0 V, a P channel transistor Q121 is turned on, and N channel transistors Q133 and Q135 are turned off. Further, since the potential of the signal A is 5 V, an N channel transistor Q132 is turned on. Since the potential of the supply voltage is 5 V (Vcc), an inversion signal of the node 4 is outputted to the select line DSL of the selected drain side. That is, the potential of the drain side select line DSL of the selected row subdecoder changes to 5 V (Vcc) and the potential of the drain side select line DSL of the non-selected row subdecoder changes to 0 V.

Further, since the potential of the signal D is 5 V and that of the signal E is 0 V, an N channel transistor Q134 is turned on and an N channel transistor Q136 is turned off. Therefore, the potential of the source side select line of the selected row subdecoder changes to a voltage which is lower than the potential at the node 1 (5 V) by the threshold value voltage of the N channel transistor Q134. Further, the potential of the source side select line SSL of the non-selected row subdecoder changes to 0 V, which is the same as that at the node 1. Therefore, a data is read from a memory cell connected to the control line CTLO in the block (NAND bundle) connected to the selected row subdecoder.

The data writing operation will be described hereinbelow. In the same way as with the case of the read operation, since the potential of the signal A is 5 V, and the potential of the signal B is 0 V, the potential at the node 2 is the same as that at the node 1. However, since the potential of VA is the write voltage 20 V (Vpp), the potential at the node 3 of the select row subdecoder changes to 20 V and the potential at the node 4 changes to 0 V both by a level shifter circuit 140. Further, by the level shifter circuit 140, the potential at the node 3 of the non-selected row subdecoder 202 changes to 0 V and the potential at the node 4 changes to 20 V.

As a result, in the selected row subdecoder 202, the output gate 110 of the row subdecoder is turned on, the potential Vpp (20 V) of the CG0 is outputted to the control line CTL0, and the potentials VP1 (10 V) of CG1 to CG7 are outputted to the control lines CTL1 to CTL7, respectively. Further, in the non-selected row subdecoder 202, the output gate 110 is turned off and the discharge N channel transistor 111 is turned on, so that all the control lines are set to 0 V.

Further, upon reading, since the potentials of the signals A and C change to Vcc and 0 V, respectively, in the selected row subdecoder the P channel transistors Q121 and Q122 are turned on and the N channel transistors Q131 and Q133 are turned off, so that the potential of the drain side select line DSL changes to the potential of the supply voltage VB (10 V). Further, since the potential at the node 4 of the non-selected row subdecoder changes to the potential (20 V) of the supply voltage VA, the P channel transistor Q122 and the N channel transistor Q133 are turned off and the N channel transistors Q131 and Q132 are turned on, so that the potential of the drain side select line DSL changes to 0 V. Accordingly, when the control line CTLO is selected from the control lines CTLO to 7, it is possible to selectively write a data to the memory cell connected to the control line CTLO selected by the row subdecoder (the node 1 is at 5 V) selected by the row main decoder.

The erasure operation will be described hereinbelow. The potential of the erase signal A is 0 V and that of the signal B is Vcc. Therefore, the switch 101 is turned off and the switch 102 is turned on. Accordingly, the output gate 110 of the selected subdecoder is turned off and the discharge N channel transistor array 111 is turned on, so that a voltage of 0 V is outputted to the control lines CTLO to 7. In contrast with this, since the output gate 110 of the row subdecoder of the non-selected status is turned on and the discharge N channel transistor array 111 is turned off, the potentials of the CGO to 7 are outputted to the control lines CTLO to 7 of the row subdecoder of non-selected status. As shown in FIG. 12, the potentials of this CGO to 7 are all set to 0 V in the case of the chip erasure. As a result, a voltage of 0 V is outputted to the control lines CTLO to 7 of the selected row subdecoder and to the control lines CTLO to 7 of the non-selected row subdecoder. At the erasure operation, the potential of the memory cell substrate is set to 20 V, so that all the memory cells of the chip can be erased.

Further, as shown in FIG. 12, when the block is erased, the potentials of the CGO to 7 are all set to Vpp (20 V). As a result, a voltage of 0 V is outputted to the control lines CTLO to 7 of the selected batch erase block and a voltage of 20 V is outputted to the control lines CTLO to 7 of the non-selected batch erase block. Since the substrate potential of the memory cells is set to 20 V in the case of block erasure, although electrons at the floating gates of the memory cells to which the control lines CTL of the selected row subdecoder are connected are extracted to the substrate, electrons at the floating gates of the memory cells to which the control lines CTL of the non-selected row subdecoder are connected will not move. As a result, it is possible to erase only the NAND bundle to which the control lines CTL of the selected row subdecoder are connected, by selecting the row subdecoder.

Further, since the signals A, B, C and D are set to the potentials as listed in FIG. 11, the P channel transistor Q121 and the N channel transistors Q132, Q134 and Q136 are turned off and the N channel transistors Q135 are turned on. As a result, a voltage lower than the supply voltage Vpp (20 V) by the threshold value of the N channel transistor Q133 or Q135 is outputted to all the select gates on the drain and source sides in erasure, to reduce the electric field generated between the gates of the select gate transistors and the substrate.

Figure 14:
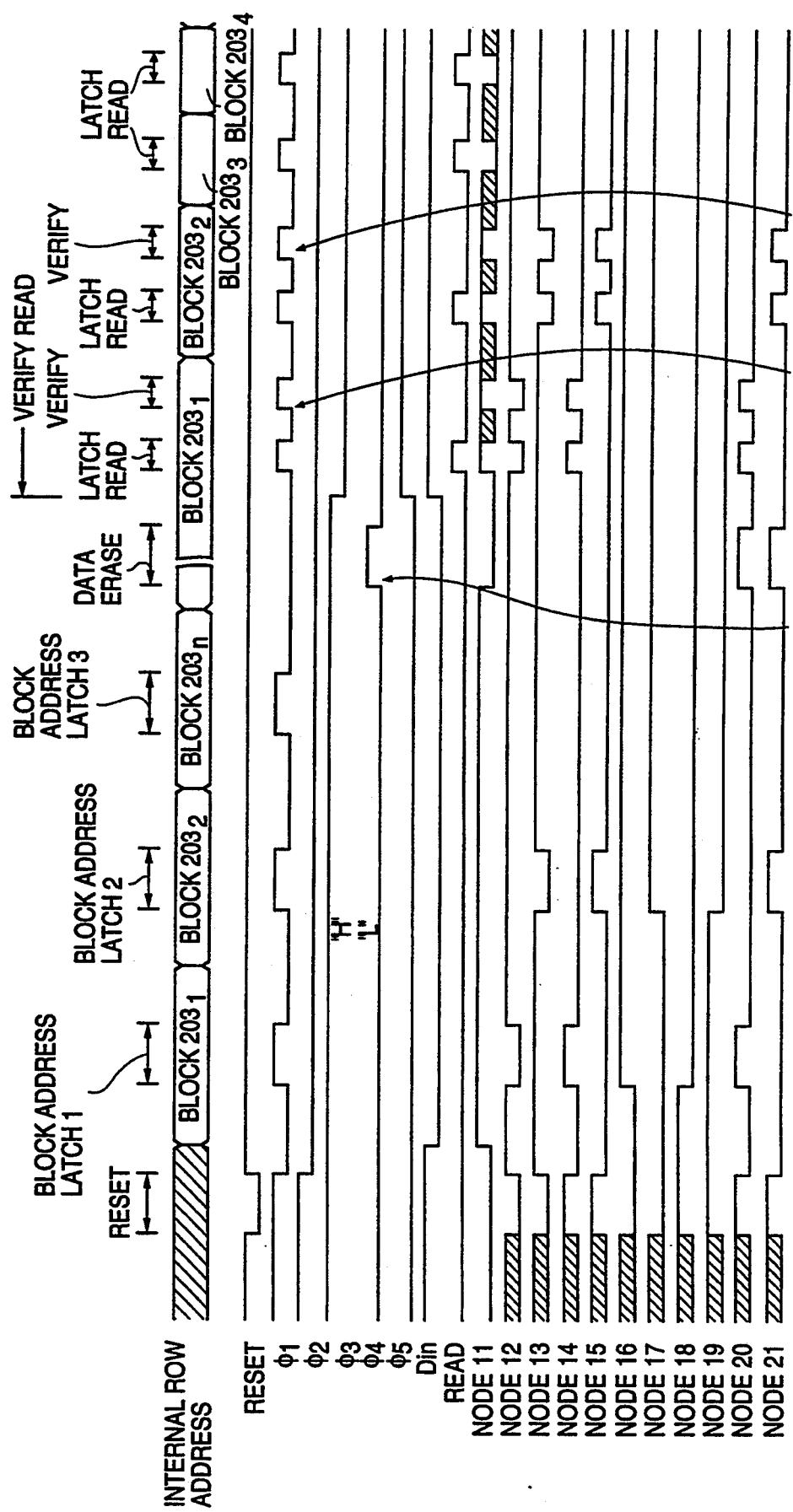
FIG. 14 is a timing chart of the first embodiment of the present invention.

Here, the operation of the latch circuit 201 connected to the main decoder will be described hereinbelow, which is the gist of the present invention. The latch circuit 201 functions as erased information holding means for holding erased information. FIG. 13 is a flowchart for assistance in explaining the block erasure operation with the use of the circuit shown in FIG. 2. Further, FIG. 14 is a timing chart for assistance in explaining the same.

When the block erasure is made, the output signal of the row main decoder 200 is latched by the latch circuit 201. Prior to this latch operation, a reset signal for initializing all the latch data is changed from "H" to "L". As a result, since the predecoder output signal as shown in FIG. 9 changes to "H" for a predetermined time period and further a signal Φ1 is at "H", all the subdecoders are in the select status.

In more detail, in the case of a latch circuit $201_1$ connected to the row subdecoder $202_1$, a node 12 is at "L" and a node 14 is at "H", so that a switch 241 composed of a P channel transistor and an N channel transistor is turned on. Further, since a node 14 is at "H" and a signal Φ3 is at "H", the output of a NAND gate 251 is at "L", so that an N channel transistor 312 is turned off. Further, at this time since a signal Φ2 is at "H", a P channel transistor 211 is turned off.

As described above, under the condition that the switch 241 is turned on and a P channel transistor 211 and an N channel transistor 312 are turned off, when a node 11 is set to "L" in response to a signal Φ5 and a signal Din, a node 16 changes to "L" via the switch 241. As already described, since all the outputs of the row main decoder 200 are set to the select status, the latch circuit $201_i$ (i=2 to 256) kept in the same status as that of the latch circuit $201_1$.

Thereafter, when the reset signal changes to "H" and the signal Φ1 changes to "L", the node 12 changes to "H" and the node 14 changes to "L", so that the output of the NAND gate 251 changes to "H". Accordingly, the N channel transistor Q312 is turned on. Further, at this time, since the signal Φ2 changes to "L", the P channel transistor Q211 is also turned on. As a result, a clocked invertor 321 composed of P channel transistor Q211 and Q212 and N channel transistors Q311 and Q312 changes to an enable status, so that "L" at the node 16 and "H" at the node 18 are held as logic information data. In the same way, in the latch circuit $201_i$ (i=1 to 256) the nodes corresponding to the nodes 16 and 18 are reset to logic levels "L" and "H", respectively.

Upon completion of the reset operation, block address latch operation is effected to store a block address information for the succeeding block erasure to the latch circuit $201_i$ (i=1 to 256). FIG. 14 shows the procedure of executing block erasure for the batch erase blocks $203_1$, $203_2$ and $203_n$.

First, in order to erase the batch erase block $203_1$, an internal row address of the batch erase block $203_1$ is input from a row address generating circuit formed in the chip. After the input data has been confirmed, the signal Φ1 is set to "H" for a predetermined time period. As a result, in the latch circuit $201_1$ of the block selected by the predecoder output signal, the node 12 is at "L" and the node 14 is at "H", so that the switch 241 is turned on.

Since the signal Φ2 is at "L", although the P channel transistor Q211 is kept turned on, since the node 18 is kept at H by the afore-mentioned reset operation, the P channel transistor Q212 is turned off. Further, since the signal Φ3 is at "H", the output of the NAND gate 251 is at an inverted level of the node 14 (kept at "H"), so that the N channel transistor Q312 is turned off. As described above, since the P channel transistor Q212 and the N channel transistor Q312 are both turned off and further the switch 241 is turned off, the potential level at the node 11 is transferred to the node 16.

In the block address latch operation, since the signal Φ5 is at "L" and the signal Din is at "L", the node 11 is at an inverted level of the signal Din ("H"); as a result, the node 16 is at "H" and the node 18 is at "L". After a predetermined time has elapsed, when the signal Φ1 changes from "H" to "L", the node 12 changes to "H", and the node 14 changes to "L", so that the switch 241 is turned off. At the same time, the clocked invertor 321 is enabled, so that "H" at the node 16 and "L" at the node 18 are held. As described above, an information data "H" for block erasure is stored at the node 16 of the latch circuit $201_1$.

In the row subdecoder $202_2$ and the latch $201_2$ of the non-selected block, since any of the predecoder outputs are at "L" even when the signal Φ1 is at "H", the node corresponding to the node 12 is kept at "H" and the node corresponding to the node 14 is kept at "L". Accordingly, an information data of "H" will not be written to the latch circuit $201_2$. As described above, the clocked invertor 322 and the row main decoder 200 function as erase information inputting means; a batch erase block $203_1$ is selected by the row main decoder 200 on the basis of the address signal; and the erase information is held by a latch circuit $201_1$ only when the input signal Din of the clocked invertor 322 is at "L".

Thereafter, control proceeds to the succeeding block address latch (2) operation. That is, when the external address changes and the batch erase block $203_2$ is selected, the node 13 changes to "L" and the node 15 changes to "H" in the same way as with the case of the afore-mentioned operation, so that "H" is held at the node 17 and "L" is held at the node 19.

In the same way, when the batch erase block $203_n$ is selected by the block address latch (3) operation, an information data for block erasure is stored in the latch circuit in the same way as already mentioned above.

Sequentially, after the completion of the block address latch operation, control proceeds to the data erase operation. That is, after the afore-mentioned block address latch operation ends and thereby a data erase command is input, control begins to erase data in the chip. At this time, the signal Φ4 changes from "L" to "H", so that the afore-mentioned latch data is transferred to the respective row subdecoders $202_i$ (i=1 to 256). The case of the latch circuit $201_1$ and the row subdecoder $202_1$ connected to the batch erase block $203_1$ will be explained hereinbelow. Since the signal Φ4 is at "H", the switch 242 composed of the N channel transistor and the P channel transistor is turned off, and further the switch 243 composed of the N and P transistors is turned on. As a result, "L" at the node 18 is transferred through the switch 243, and the node 20 becomes at an inverted level thereof ("H"). Thereafter, the row subdecoder $202_1$ begins to operate as described before, so that the memory cells of the batch erase block $203_1$ are erased.

At the same time as when the memory cells in the batch erase block $203_1$ are erased, another erasure operation is made for the row subdecoder 202 connected to all the latch circuits 201 for storing the preceding block erase information data. In this case, the three batch erase blocks $203_1$, $203_2$ and $203_n$ are erased simultaneously.

As described above, in the block address latch operation of the first embodiment, the select signal outputted from the row main decoder is latched by the latch circuit; and by repeating the above operation, the erase information data are stored in the latch circuits corresponding to a plurality of batch erase blocks. Further, the erase information data stored in the latch circuits are transferred to the row subdecoders to simultaneously erase the plural blocks connected to the plural row subdecoders to which the erase information data are transferred. As described above, since a plurality of blocks are erased simultaneously, it is possible to shorten the time required for erasure, as compared with the prior art memory device.

A verify read operation for verifying whether data are erased reliably is described hereinbelow. With reference to the timing chart shown in FIG. 14, when control proceeds to the verify read mode, the signal $\Phi 3$ changes from "H" to "L". As a result, the output signal of a NAND gate 251 of the latch circuit $201_1$ is set to "H", irrespective of the level of the node 14, so that the N channel transistor Q312 is turned on. Further, since the signal $\Phi 2$ is at "L", the clocked invertor 321 is set to an enable status during the verify read operation. The clocked inverters of the latch circuits corresponding to the other blocks are also enabled.

As shown in the flowchart of FIG. 13, before erasure operation, the internal block address is set to "0" (step S106). Therefore, where the internal block address selects the batch erase block $203_1$ after data erasure, when the signal $\Phi 1$ is set to "H" for a predetermined time period, the node 12 changes to "L" and the node 14 changes to "H", so that the switch 241 is turned on. At this time, since the signal $\Phi 5$ is at "H", the clocked invertor 322 is disabled, so that the block erase signal of "H" latched at the node 16 by the block address operation is transferred to the node 11.

Further, as already described, since the clocked invertor 321 has been enabled, the latched data is not destroyed by this data transfer operation. Further, in the latch circuits $201_i$ (i=2 to 256) corresponding to the other blocks, since any of the predecoder output lines are at "L", the nodes corresponding to the node 12 are at "H" and the nodes corresponding to the node 14 are at "L", so that the latch data of the other blocks are not outputted to the node 11.

In this case, since a signal READ is at "H", the signal outputted to the node 11 is read as a signal SEN via the NAND gate 255 and the invertor 256. The NAND gate 255 and the invertor 256 function as means for outputting erase information holding signal. In this case, since the batch erase block $202_1$ is selected, the signal SEN of "H" is read out. After the signal SEN of "H" has been outputted, the verify read operation starts for all the memory cells connected to the control lines CTL0 to 7 outputted from the row subdecoder $202_1$.

Further, if the signal SEN is not at "H", the internal address is only incremented, as indicated by the step S115 of flowchart shown in FIG. 13. Here, the block address of "0" indicates an internal address of the batch erase block $203_1$. In the same way, the block address of "1" indicates an internal address of the batch erase block $203_2$. Further, an address in the block indicates an address of the memory cells connected in series within the block. Here, if the erasure operation fails three times in the flowchart shown in FIG. 13, control proceeds to error processing (in steps S112 and S117). The flowchart shown in FIG. 13 is executed by a sequencer composed of logic gates within the chip.

As described above, in the first embodiment, when the block erase information is at "L" level, data are not read from the block. In other words, when an erase information data has been already stored in the erase information holding means and further the block selecting means selects a corresponding batch erase block, the erase information holding signal outputting means outputs an erase information holding signal. In this case, the succeeding verify operation is not executed for the batch erase block which outputs the erase information holding signal of "L" level. Therefore, it is possible to confirm the completion of the block erasure at a short varify time without reading data from all the memory cells, thus shortening the erasure time including the verify time.

In addition, it is possible to test the first decoder by outputting the erase information holding signal in the first embodiment. In more detail, in the die sort test for selecting non-defective chips, the first decoders are all operated evenly by changing addresses. Further, the erase information data are held at all the latch circuits corresponding to all the batch erase blocks, and successively the erase information holding signals are outputted in sequence. Here, when the erase information data have been held by all the latch circuits corresponding to the batch erase blocks, if there exists a batch erase block from which the erase information holding signal is not outputted, this indicates a defective decoder. Here, if the number of blocks corresponding to the defective decoder outputs is small, the decoders can be relieved by redundant circuits. The relieved chip is sent to the succeeding process. However, if the number thereof exceeds the relief limit, the chip is determined as being defective without performing the succeeding write and erase tests. Therefore, it is possible to detect the defective chips at high speed.

Further, in the read operation, it becomes possible to construct partially in common two decoders. That is, one decoder is a block select decoder used when the erase information holding means transmits the block select signal to the corresponding batch erase block in erasure operation, and the other decoder is a decoder used for data reading. Therefore, it is possible to reduce the chip area by that corresponding to the chip area for the block select decoder. The above-mentioned construction is possible irrespective of NAND and NOR types.

Figure 15:
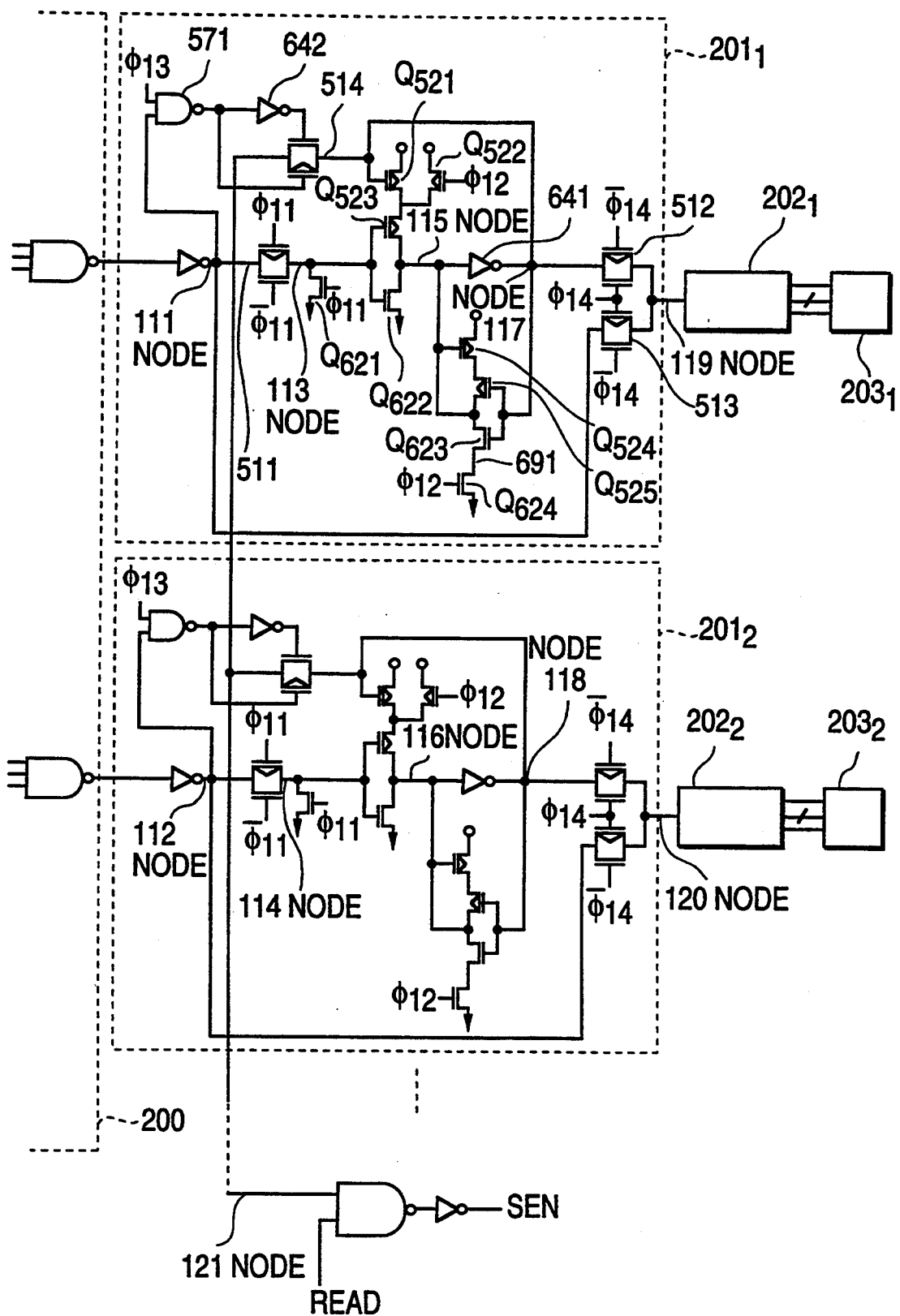
FIG. 15 is a circuit diagram showing a second embodiment of the present invention.
Figure 16:
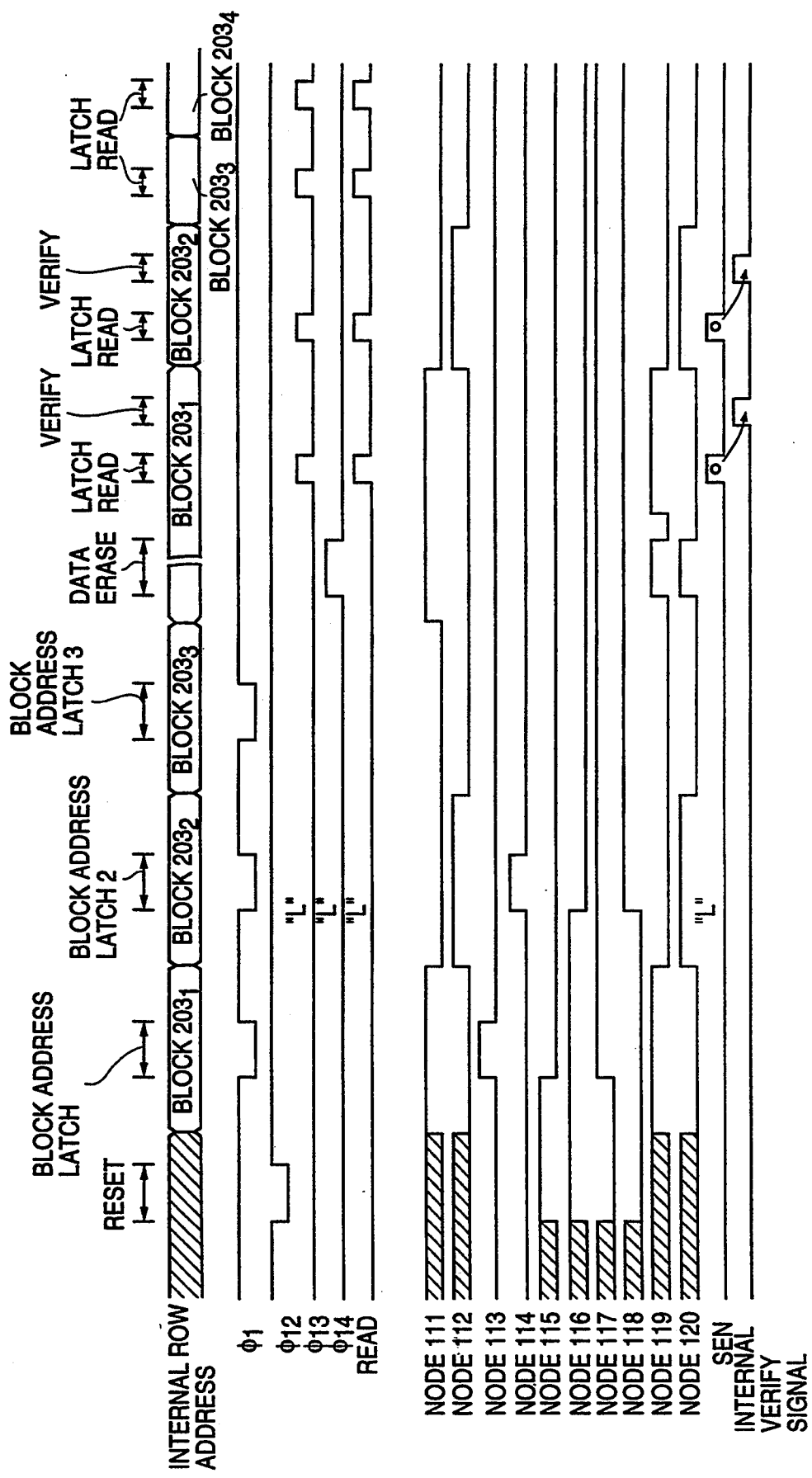
FIG. 16 is a timing chart of the second embodiment of the present invention.

A second embodiment of the present invention will be described hereinbelow, in which the latch circuits of different circuit configuration are incorporated at the output stage of the row main decoder. FIG. 15 is a circuit diagram and FIG. 16 is a timing chart showing the verify operation executed after the erasure operation.

The latch circuit $201_i$ (i=1 to 256) includes inverters 641 and 642, a NAND gate 571, switches 511, 512, 513 and 514, N channel transistors Q621 and Q622, P channel transistors Q521, Q522 and Q523, and a clocked invertor 691 composed of P channel transistors Q524 and Q525 and N channel transistors Q623 and Q624. The latch is performed by the invertor 641 and the clocked invertor 691.

In the block erase operation, in the same way as with the case of the first embodiment, a data held by the latch circuit is reset. A signal $\Phi 12$ changes from "H" to "L". Here, since a signal $\Phi 11$ is at "H", the switch 511 is turned off and the N channel transistor Q621 is turned on, so that a node 113 is set to "L". Accordingly, since the P channel transistors Q522 and Q523 are turned on and the N channel transistors Q622 and Q624 are turned off, a node 115 is reset to "H" and a node 117 is reset to "L". After a predetermined time has elapsed, when the signal $\Phi 12$ changes from "L" to "H", although the P channel transistor Q522 is turned off, since the node 117 is set to "L", the P channel transistor Q521 is turned on and the node 115 is held at "H" of the inverted level of the node 113 of "L". Further, since the node 117 is at "L", the N channel transistor Q623 is turned off, so that no current flows from the node 115 to the ground even if the signal Φ12 changes from "L" to "H". By the above-mentioned reset operation, all the latch circuits 201 corresponding to all the blocks are reset.

Next, the block address latch operation for setting the block erase signal to the latch circuit 201 will be described. After the internal address for selecting the batch erase block $203_1$ had been determined, the signal Φ11 changes from "H" to "L". As a result, the switch 511 is turned on and the N channel transistor Q621 is turned off, so that the potential "H" at the node 111 is transferred to the node 113. After the above-mentioned reset operation, although the P channel transistor Q521 is kept turned on, since the P channel transistor Q523 is turned off and the N channel transistor Q622 is turned on, the node 115 changes from "H" to "L", so that the node 117 changes from "L" to "H". As described above, the latch node 117 is set to "H". With respect to the other latch circuits corresponding to the other blocks, since any of the predecoder signals of the row main decoder are at "L", even if the switches corresponding to the switch 511 are turned on, the nodes corresponding to the node 115 are not set to "L" level. In other words, only the latches of the blocks selected by the row main decoder are set.

The above-mentioned operation is repeated in sequence for the other blocks to be erased. FIG. 16 is a timing chart for erasing three batch erase blocks of $203_1$, $203_2$ and $203_3$.

Therefore, if the signal Φ11 changes from "L" to "H", the set data is held. In the circuit configuration of the second embodiment, the P channel transistor Q521 is driven by the voltage at the node 117. When the node 117 is latched to "H" by the block address latch operation, the P channel transistor Q521 is turned off and the invertor composed of the P channel transistor Q523 and the N channel transistor Q622 is disabled. Therefore, the inverted signal at the node 113 is not transferred to the node 115. In other words, even if the address latch operation is made for the other blocks, the latch circuits for the non-selected blocks keep holding the data.

After the address latch operation has been made for the blocks required to be erased as described above, the signal Φ14 is changed to "H" for a predetermined time period for data erasure. When the signal Φ14 is kept at "H", the switch 513 is turned off and the switch 512 is turned on, so that the potential at the node 117 is transferred to the node 119. As a result, all the control lines of the selected block connected to the selected row subdecoder are set to 0 V, and all the control lines of the non-selected block are set to Vpp. As a result, in the same way as with the case of the first embodiment, it is possible to erase a plurality of selected blocks within the same time as the batch erasure. Upon the end of the batch erasure operation, if the signal Φ14 is set to "L", the switch 512 is turned off and the switch 513 is turned on, so that the potential at the node 111 is transferred to the node 119. The data read and write operation is effected usually under these conditions.

As described above, in the second embodiment in the same way as in the first embodiment, in the block address latch operation, the select signal of the output of the row main decoder is latched by the latch circuit. By repeating the above operation, the erase information data are stored in the latch circuits corresponding to a plurality of batch erase blocks. Further, the erase information data stored in the latch circuits are transferred to the row subdecoders to erase simultaneously the plural blocks connected to the plural row subdecoders to which the erase information are transferred. As described above, since a plurality of blocks are erased simultaneously, it is possible to shorten the time required for erasure, as compared with the prior art device.

The verify read operation after the erase operation will be described. In the same way as with the case of the operation sequence of the first embodiment, in response to the signal READ, the potential at the node 121; that is, the potential at the node 117 is outputted as a signal SEN in the latch read operation. When the potential at the node 111 is at "H" and the signal Φ13 is at "H", the switch 514 is turned on and the latch data at the node 117 is outputted to the node 121. Under these conditions, since the switches corresponding to the switch 514 in the latch circuits corresponding to the non-selected blocks are turned off, a plurality of data are outputted to the node 121 without destroying the latch data.

The verify read operation is achieved only when the signal SEN is at "H"; that is, for the block whose latch data is at "H". In the same way as in the first embodiment, the sequence operation as shown by the flowchart in FIG. 13 is executed. This sequence operation is composed of logic gates, and realized by a sequence circuit formed within the chip of the nonvolatile semiconductor memory device. On the basis of this sequence, it is possible to confirm finally that the memory cells of all the batch erase blocks designated by the block address latch operation are erased sufficiently.

As described above, in this second embodiment in the same way as in the first embodiment, when the block erase information is at "L", data in the block are not read. Therefore, it is possible to confirm that the block erasure has been completed at a short verify time without reading data of all the memory cells, thus reducing the erase time including the verify time.

Figure 17:
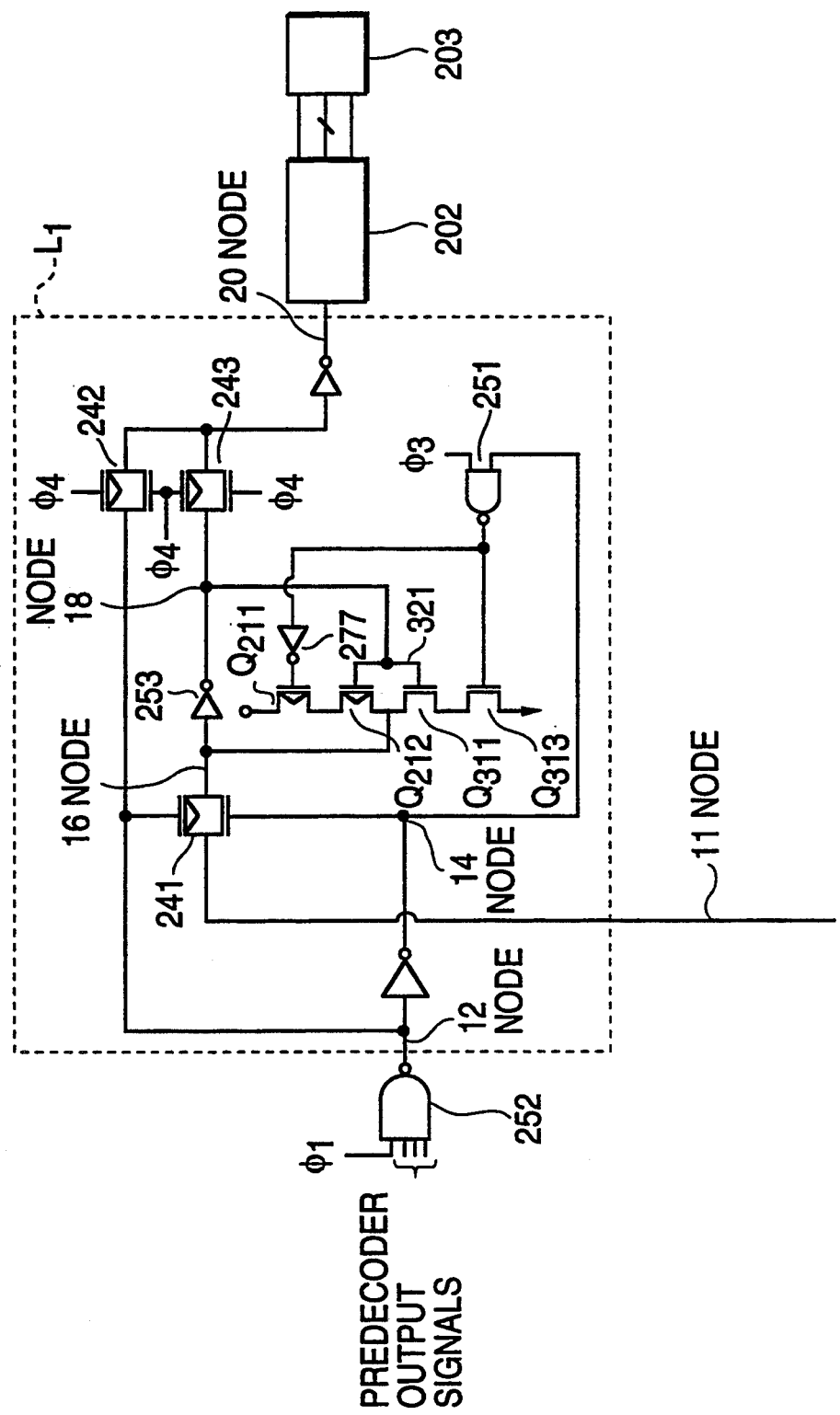
FIG. 17 is a circuit diagram showing a third embodiment of the present invention.

A third embodiment which is a modification of the first embodiment will be described with reference to FIGS. 17 and 18. In FIG. 17, the same reference numerals have been retained for the similar elements and the nodes which have the same functions as with the case of the first embodiment. The point different from the first embodiment is that a signal obtained by inverting an output signal of the NAND gate 251 through the invertor 277 is input to the gate of the P channel transistor Q211 instead of the signal Φ2. In the latch operation for the selected block, when the potential at the node 11 is transferred to the node 16 via the switch 241, the P channel transistor Q211 and the N channel transistor Q312 are turned off, in order to enable the latch operation by transferring "L" or "H" to the node 16.

Figure 18:
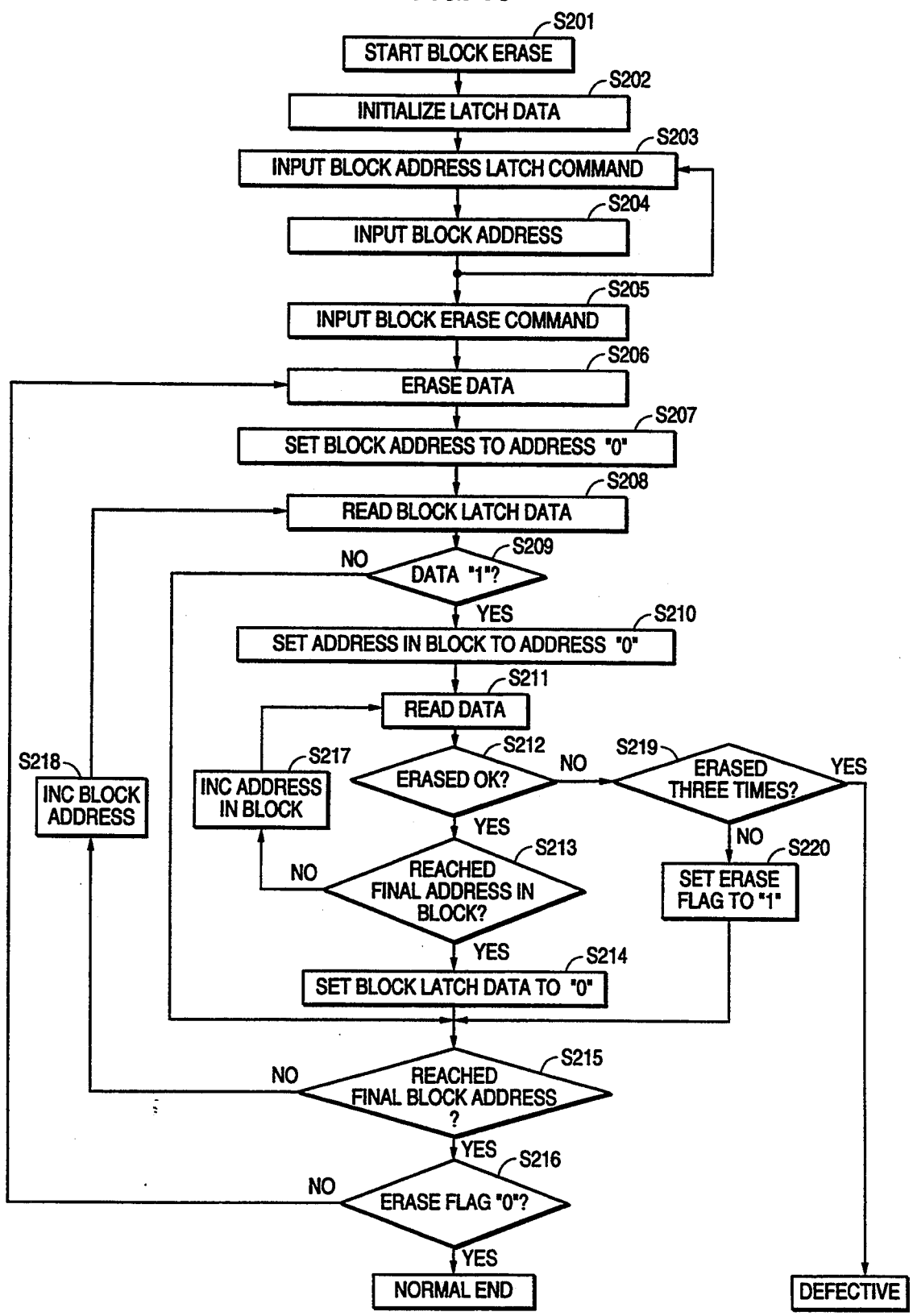
FIG. 18 is a flowchart for explaining the block erase operation according to the third embodiment of the present invention.

FIG. 18 is a flowchart showing the chip internal operation for erasing the block by the circuit of the third embodiment. In this embodiment, the point different from the first embodiment shown in FIG. 13 is that the latch data (the block erase signal) are read after the data have been erased, and the latch data "H" of the latch circuits corresponding to the block are changed to "L" only when all the memory cells in the block are erased sufficiently. In this embodiment, the block erase data of "H" stored in the latch circuits corresponding to the block already erased are reset to "L" from the address No. "0" to the final address number. In addition, in case where there exist memory cells not sufficiently erased, an erase flag data is set to "1" to erase the memory cells again.

Therefore, it is possible to prevent the memory cells from being erased excessively without erasing the sufficiently erased memory cells again. This is because when the memory cell is erased excessively, since the electric field between the floating gate and the substrate increases, there exists a problem in that dielectric breakdown occurs at the oxide film between the floating gate and the substrate. Therefore, since the excessive erasure can be suppressed by erasing only the block including the memory cells not sufficiently erased in accordance with the flowchart shown in FIG. 18, it is possible to improve the chip reliability. Further, in the circuit configuration as shown in FIG. 17, it is of course possible to obtain the same effects as in the case of the first and second embodiments.

Further, it is possible to know the address of the defective block by outputting the erase information holding signal of the latch circuit in the test node. In more detail, when [defective] is checked in spite of the fact that a plurality of the blocks are erased simultaneously in the automatic erase mode, the erase information holding signals are outputted in sequence to the outside, in order to detect the defective batch erase blocks to each of which an erase flag of "1" (erase information) is set. As described above, it is possible to detect the blocks defective in erase.

In the above-mentioned first-to third embodiments, when the block addresses of the batch erase blocks are input, the block addresses of the corresponding batch erase blocks are all input simply from the outside. In other words, when five batch erase blocks are required to be erased, it is necessary to input the block addresses five times from the outside.

A fourth embodiment will be described hereinbelow, by which when a plurality of continuous batch erase blocks are required to be erased, the head address and the number of the continuous blocks are input in sequence to erase these blocks on the basis of the input information.

Figure 19:
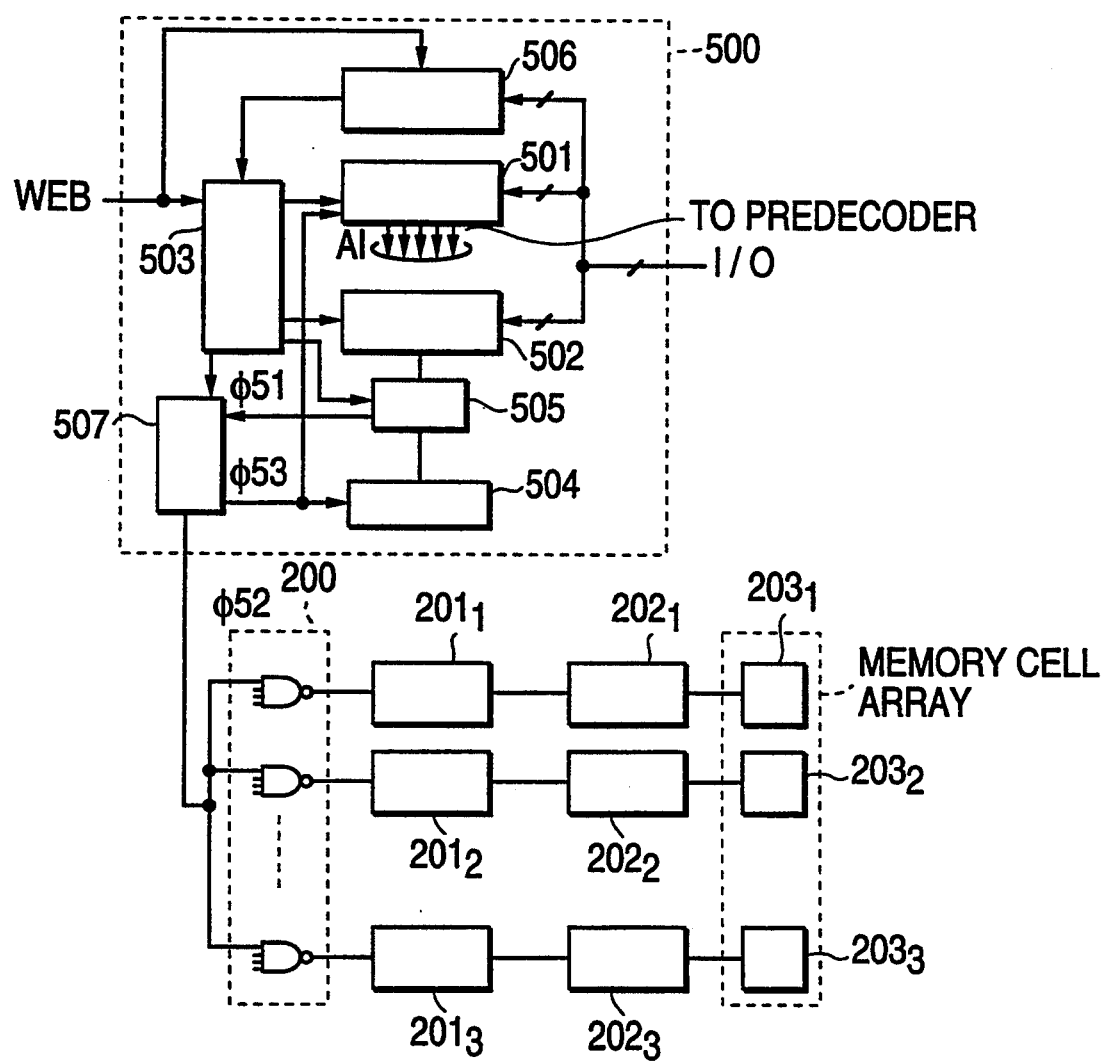
FIG. 19 is a circuit diagram showing a fourth embodiment of the present invention.

FIG. 19 shows a fourth embodiment of the present invention. The circuit comprises a row main decoder 200 including a predecoder circuit, latch circuits 201 for holding erase information, row subdecoders 202 controlled by a presence or absence of the erase information held by the latch circuits respectively, batch erase blocks 203 composed of a plurality of nonvolatile memory cells, and a control circuit 500 for controlling the operation of the latch circuits 201 corresponding to the plural continuous batch erase blocks to be erased when the erase information is held.

The control circuit 500 comprises an address latch circuit 501 of binary counter type for holding an address input through an I/O terminal and for functioning as a counter, a block number latch circuit 502 for latching the number of continuous blocks input through I/O terminal, a latch timing generating circuit 503 for outputting latch timing pulses, to the circuits 501 and 502 a binary counter 504 for counting the number of times that the erase information data are held by the latch circuits 201, a comparator circuit 505 for comparing the number of data latched by the block number latch circuit 502 with the number of the binary counter and outputting a signal of "L" when both match and of "H" when both not match, a command decoder 506 for decoding the command input through the I/O terminal, and a timing generating means 507 for outputting a timing pulse for holding the erase information by the latch circuit 201 and a timing pulse for counting up the latch data of the address latch circuit 501.

Figure 20:
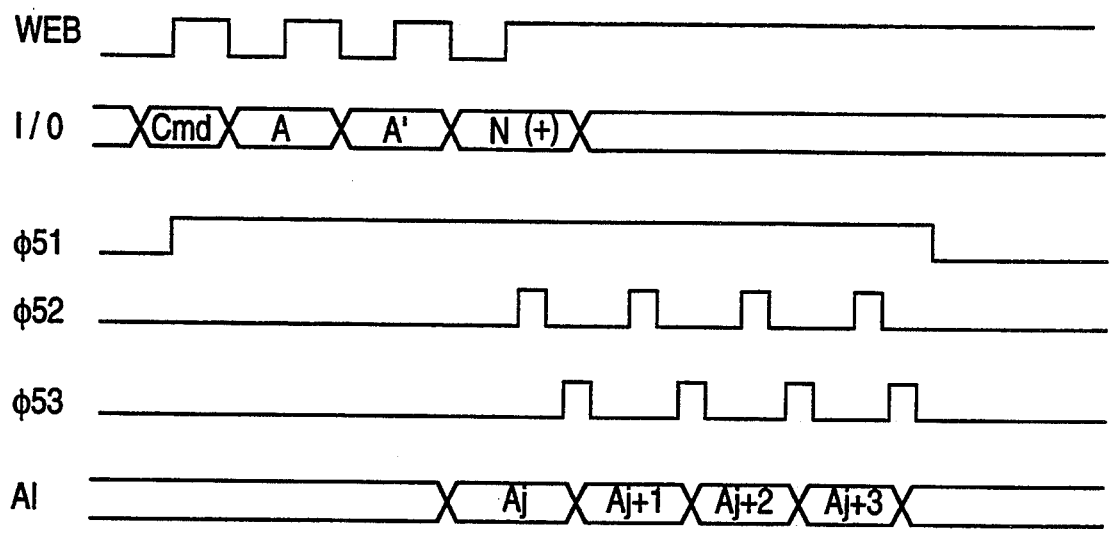
FIG. 20 is a timing chart of the fourth embodiment of the present invention.

The operation of the fourth embodiment will be described with reference to the timing chart shown in FIG. 20. In response to the first rising edge of a signal WEB input, from the outside the command decoder latches a command data on the I/O terminal and further decodes the latched command data. When the decoded result is a block erase command, the counter 504 is reset, and the comparator 505 is activated so that the signal $\Phi 51$ rises to "H". In response to the second and third rising edges of the signal WEB, the address latch circuit 501 latches a block address signal of 8 or more bits. The block address signal is input to the predecoder of the row main decoder, and converted into an internal address AI. Successively, in response to the fourth rising edge of the signal WEB, the number N of the erased blocks is latched by the block number latch circuit 502. An example of number N=4 is shown in this embodiment. Thereafter, the timing generating circuit 507 outputs the signals $\Phi 52$ and $\Phi 53$ alternately.

In response to the first pulse signal $\Phi 52$, the predecoder of the row main decoder 200 is activated for selection operation, so that the erase information is held by the latch circuit 201 of the batch erase block corresponding to the internal address AI(Aj). Successively, in response to the first pulse signal $\Phi 53$, the counter 504 is incremented, and the address latch circuit 501 is also incremented to designate the succeeding batch erase block. Successively, in response to the second pulse signal $\Phi 52$, the predecoder of the row main decoder 200 is activated for select operation again. As a result, the erase information is held by the latch circuit 201 of the batch erase block corresponding to the internal address AI (Aj+1). Successively, in response to the second pulse $\Phi 53$, the counter 504 and the address latch circuit 501 are both incremented to designate the succeeding batch erase block. The same operation is made in response to the second and fourth pulse signals $\Phi 52$ and $\Phi 53$. When the counter 504 is incremented in response to the fourth pulse signal $\Phi 53$, since the counter value becomes equal to the latch data of the block number latch circuit 502, the comparator circuit 505 drops the signal $\Phi 51$ to "L".

By the operation as described above, when a plurality of continuous batch erase blocks are erased, the head address and the number of the continuous blocks are input in sequence in order to execute the erasure operation on the basis of only two information data. Therefore, it is possible to save trouble of inputting a plurality of addresses.

A fifth embodiment of the present invention will be described hereinbelow. In this embodiment, when a plurality of continuous batch erase blocks are erased, the head address and the number of the blocks are input in sequence in order to execute the erasure operation on the basis of these information data, in the same way as in the fourth embodiment.

Figure 21:
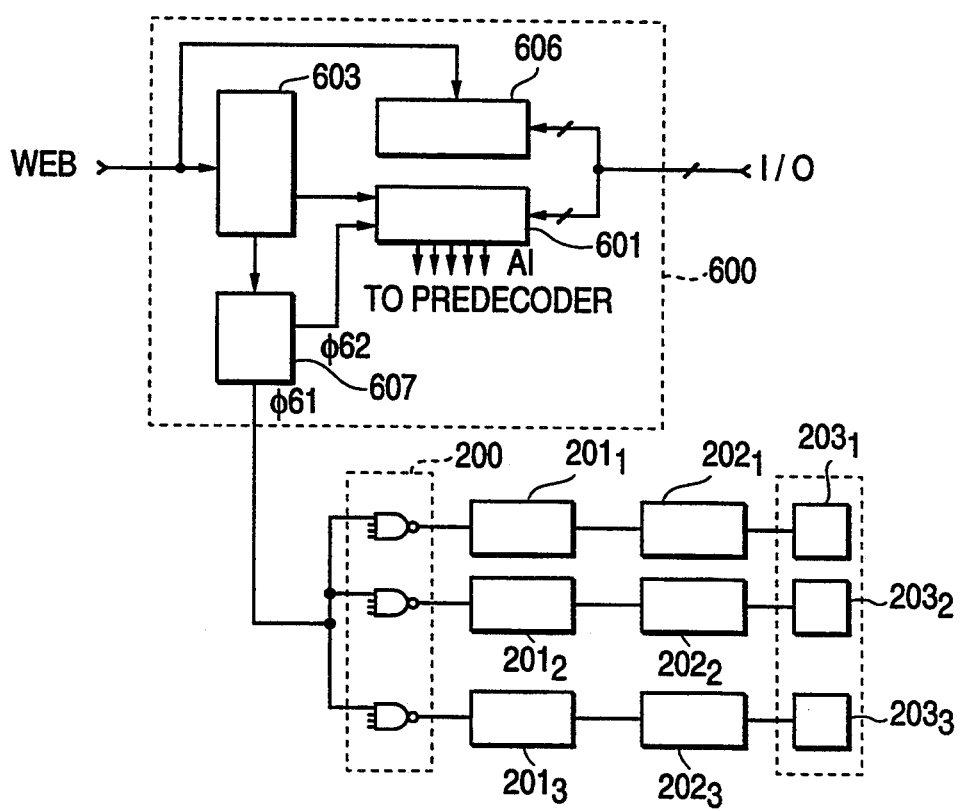
FIG. 21 is a circuit diagram showing a fifth embodiment of the present invention.

FIG. 21 shows a circuit configuration of the fifth embodiment. The circuit comprises a row main decoder 200 including a predecoder circuit, latch circuits 201 for holding erase information, row subdecoders 202 controlled by a presence or absence of the erase information held by the latch circuits respectively, batch erase blocks 203 composed of a plurality of nonvolatile memory cells, and a control circuit 600 for controlling the operation of the latch circuits 201 corresponding to the plural continuous batch erase blocks to be erased when the erase information is held.

The control circuit 600 comprises an address latch circuit 601 of binary counter type for holding an address input through an I/O terminal and for functioning as a counter, a latch timing generating circuit 603 for outputting latch timing pulses, to the address latch circuit 601 a command decoder 606 for decoding the command input through the I/O terminal, and a timing generating means 607 for outputting a timing pulse for holding the erase information in the latch circuit 601 and a timing pulse for counting up the latch data of the address latch circuit 601.

Figure 22:
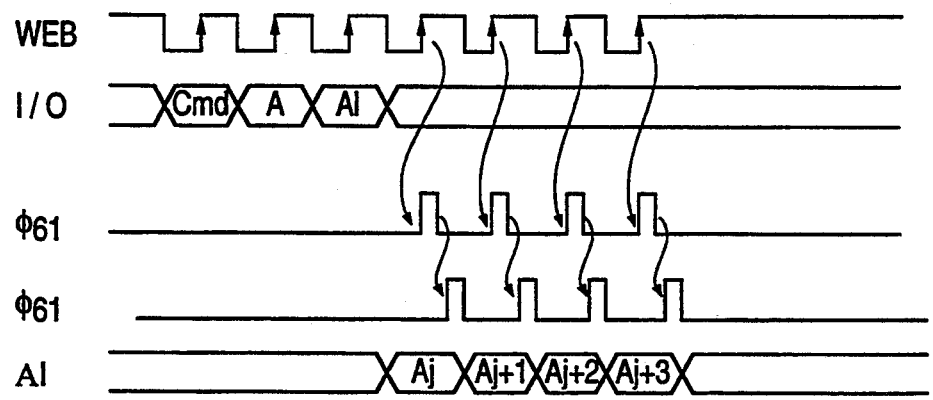
FIG. 22 is a timing chart of the fifth embodiment of the present invention.

The operation of the fifth embodiment will be described with reference to the timing chart shown in FIG. 22. In response to the first rising edge of the signal WEB input from the outside, the command decoder latches a command data on the I/O terminal and further decodes the latched command data. When the decoded result is a block erase command, control proceed to the succeeding step. In response to the second and third rising edges of the signal WEB, the address latch circuit 601 latches a block address. The block address signal is converted into an internal address AI and is used as a predecoder input signal of the row main decoder. Successively, in response to the fourth and after rising edges of the signal WEB, the timing generating circuit 607 outputs the signals Φ61 and Φ62 in sequence. That is, in response to the fourth rising edge of the signal WEB, the first pulse of the signal Φ61 is outputted, so that the predecoder of the row main decoder 200 is activated for selection operation. As a result, the erase information is held by the latch circuit 201 of the batch erase block corresponding to the internal address AI(Aj).

Successively, in response to the first pulse signal Φ62, the address latch circuit 601 is incremented to designate the succeeding batch erase block. Successively, in response to the rising edge of the fifth pulse signal WEB, the second pulse of the signal Φ61 is outputted, so that the predecoder of the row main decoder 200 is activated for select operation again. As a result, the erase information data are held by the latch circuits 201 of the batch erase blocks corresponding to the internal address AI (Aj+1). Successively, in response to the second pulse Φ62, the address latch circuit 601 is incremented to designate the succeeding batch erase block. In response to the sixth and after signals WEB, the second and fourth pulses of the signals Φ61 and Φ62 are outputted to execute the same operation.

By the operation as described above, when a plurality of continuous batch erase blocks are erased, the head address and the $\overline{WB}$ clock signals corresponding to the number of the continuous blocks are input in sequence for executing the erasure operation on the basis of only these information data.

The point different between the fourth and fifth embodiments is that the number of blocks is input as a bit data or a serial data. In the fourth embodiment, since only two kinds of input data are latched, the load of the CPU for controlling the chip is reduced and therefore the operation speed is high. However, the circuit configuration is rather complicated. In the fifth embodiment, although it is necessary to input the pulses whose number corresponds to the number of the continuous blocks from the outside, the circuit configuration can be simplified. In any embodiments, it is possible to save the trouble of inputting addresses many times, thus reducing the time required for erasure.

A sixth embodiment will be described hereinbelow, by which when a plurality of continuous batch erase blocks are erased, the first block address and the second block address are input in order to erase all the batch erase blocks sandwiched between the first and second addresses.

Figure 23:
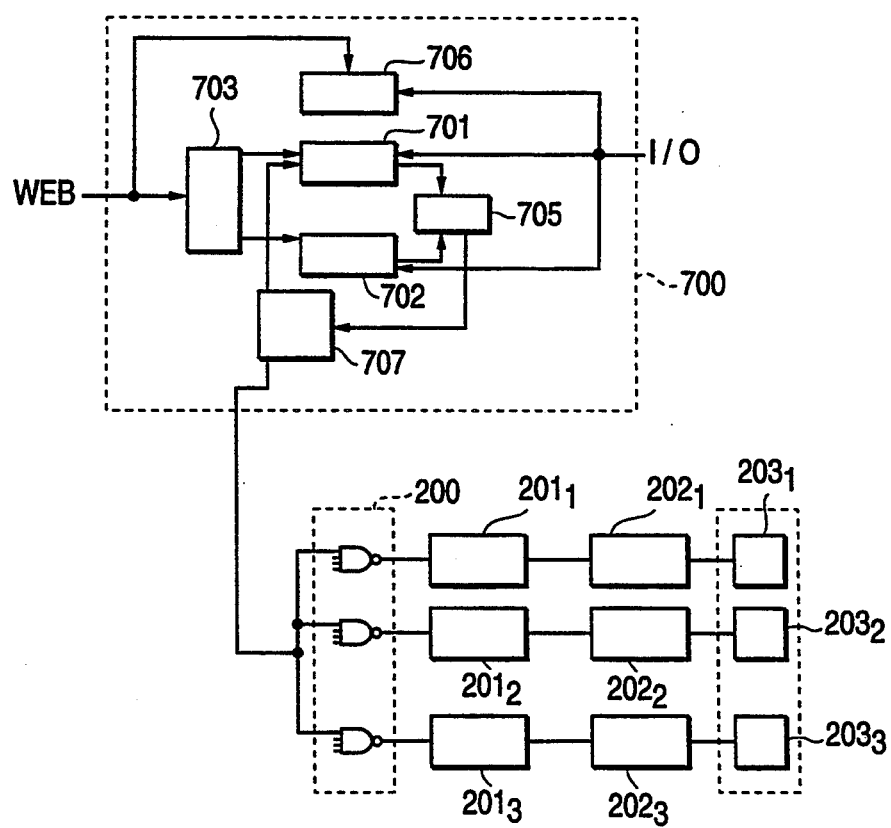
FIG. 23 is a circuit diagram showing a sixth embodiment of the present invention.

FIG. 23 shows a sixth embodiment of the present invention. The circuit comprises a row main decoder 200 including a predecoder circuit, latch circuits 201 for holding erase information, row subdecoders 202 controlled by a presence or absence of the erase information held by the latch circuits respectively, batch erase blocks 203 composed of a plurality of nonvolatile memory cells, and a control circuit 700 for controlling the operation of the latch circuits 201 corresponding to the plural continuous batch erase blocks to be erased when the erase information is held.

The control circuit 700 comprises an address latch circuit 701 of binary counter type for holding a first address input through an I/O terminal and for functioning as a counter, an address circuit 702 for latching a second address input through the I/O terminal, a latch timing generating circuit 703 for outputting latch timing pulses, to the circuits 701 and 702 a comparator circuit 705 for comparing the number of data latched by the address latch circuit 701 with the number of data latched by the address latch circuit 702 and outputting a signal of "L" when both match and of "H" when both not match, a command decoder 706 for decoding the command input through the I/O terminal, and a timing generating means 707 for outputting a timing pulse for holding the erase information by the latch circuit 201 and a timing pulse for counting up the latch data of the address latch circuit 701.

Figure 24:
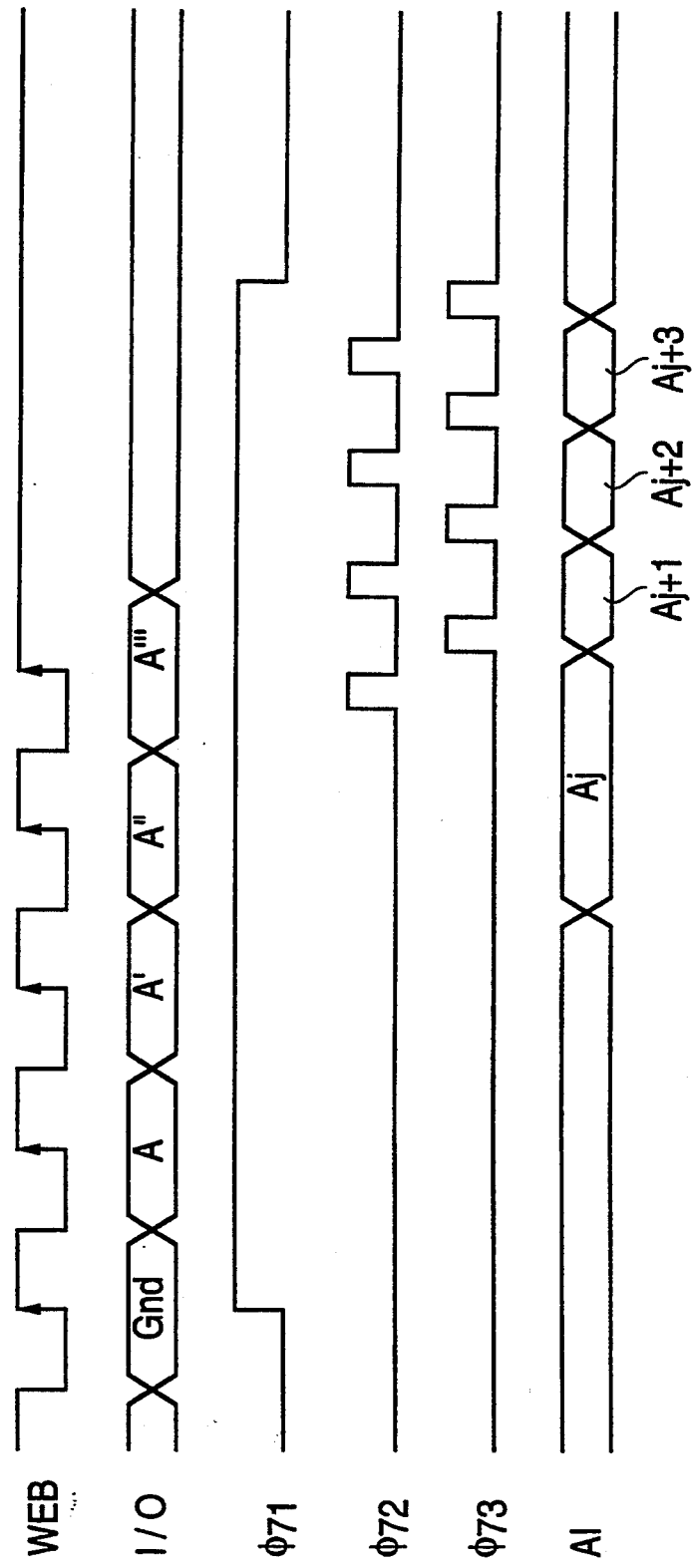
FIG. 24 is a timing chart of the sixth embodiment of the present invention.

The operation of the sixth embodiment will be described with reference to the timing chart shown in FIG. 24. In response to the first rising edge of the signal WEB input from the outside, the command decoder latches a command data on the I/O terminal and further decodes the latched command data. When the decoded result is a block erase command, the comparator circuit 705 is activated so that the signal Φ71 rises to "H". In response to the second and third rising edges of the signal WEB, the address latch circuit 701 latches the first block address signal. The block address signal is input to the predecoder of the row main decoder, and converted into an internal address AI. Successively, in response to the fourth and fifth rising edges of the signal WEB, the second block address is latched by the address latch circuit 702. Here, the case where the difference in number between the first and second addresses is 4 is explained by way of example. Thereafter, the timing generating circuit 707 outputs the signals Φ72 and Φ73 alternately. In response to the first pulse of the signal Φ72, the predecoder of the row main decoder 200 is activated for selection operation.

As a result, the erase information is held by the latch circuit 201 of the batch erase block corresponding to the internal address AI(Aj). Successively, in response to the first pulse signal Φ73, the address latch circuit 701 is incremented to designate the succeeding batch erase block. Successively, in response to the second pulse of the signal Φ72, the predecoder of the row main decoder 200 is activated for selection operation again. As a result, the erase information is held by the latch circuit 201 of the batch erase block corresponding to the internal address AI (Aj+1). Successively, in response to the second pulse of the signal Φ73, the address latch circuit 701 is incremented to designate the succeeding batch erase block. The same operation is repeated in response to the third and fourth pulses of the signals Φ72 and Φ73. In response to the fourth pulse of the signal Φ73, the comparator circuit 705 detects a match of both the data latched by the address latch circuits 701 and 702 and therefore drops the pulse signal Φ71 to "L".

By the operation as described above, when a plurality of continuous batch erase blocks are erased, the first and second addresses are input in order to erase all the batch erase blocks corresponding to the block addresses equal to or larger than the first block address and smaller than the second block address.

As described above, in the fourth to sixth embodiments, the method of holding the erase information by the latch circuit 201 has been explained. After the erase information has been held by the latch circuit 201, a plurality of the blocks are erased simultaneously in accordance with the method as described in the first to third embodiments. Therefore, it is possible to reduce the erasure time.

As described above, in the first to third embodiments, when the erase verify is made, it is necessary to make access in such a way that all the batch erase blocks are scanned. In more detail, after a plurality of blocks have been erased simultaneously, the erase information data held by the corresponding latch circuits are detected beginning from the head address in sequence, and the verify read is executed for only the block whose erase information has been detected. The erase information can be detected easily by detecting the match signal outputted from the respective latch circuits. However, if the number of the batch erase blocks is 256, for instance, the detections of 256 times are required.

A seventh embodiment of the present invention will be described hereinbelow, by which the above-mentioned detections of many times can be eliminated.

FIG. 25 shows the circuit configuration of the seventh embodiment. The circuit comprises an external address latch circuit 801 for latching addresses input from the outside and outputting internal block addresses AI, 8 registers 811 to 818 for latching internal block addresses in response to clocks Φ81 to Φ88, transfer gates 821 to 828 connected to the output stages of the registers 811 to 828 and turned on in response to the clock signals Φ91 to Φ98, a row main decoder 200, a transfer gate 830 for transferring the internal address AI to the row main decoder in response to the clock signal Φ80, a plurality of batch erase blocks 203, row subdecoders 202 corresponding to the respective blocks, and latch circuits 201 corresponding to the respective batch erase blocks. In this embodiment, although the 8 registers are shown, any number of the registers corresponding to the chip size is determined, without being limited to only 8 registers. The transfer gate is of multi-bit construction at both input and output side, which is shown in FIGS. 26A and 26B.

The operation of this seventh embodiment will be described hereinbelow. In the same way as in the first embodiment, the main operation is composed of the simultaneous erasure of the plural blocks and the verify operation for the erased blocks. When the erase information is held by the latch circuit 201, the signal Φ80 is at "H", so that the external address latch circuit 801 is connected to the row main decoder 200. Further, at the same time, the internal block addresses are latched by the registers 811 to 818. Here, the case where the first and third blocks are erased simultaneously is explained by way of example. When the internal address AI is 000H corresponding to the first block, the row main decoder 200 selects an output node corresponding to the first block, so that the erase information is held by the corresponding latch circuit 201. During this time, the signal Φ81 changes to "H", so that the block address 000H is stored in the register 811. Thereafter, since the internal address AI becomes 002H corresponding to the third block, the row main decoder 200 selects an output node corresponding to the third block, so that the erase information is held by the corresponding latch circuit 201. During this time, the signal Φ82 changes to "H", so that the block address 002H is stored in the register 812.

Successively, the batch erasure is made, so that only the blocks whose erase information data are held by the corresponding latch circuits 201 are erased. That is, the first and third blocks are erased.

Successively, a verify is made to check whether the erasure is made securely. Here, in this embodiment, only the internal addresses stored in the registers 811 to 818 are read out, and the verify operation is made on the basis of only the read data, without changing the internal block addresses AI from the first address 000H to the final address 1FFH to check whether the erase information data are held by all the corresponding latch circuits 201. In more detail, after the address latch circuit 801 is disconnected from the row main decoder 200 by changing the signal Φ80 to "L", the signal Φ91 is changed to "H", to output the internal block address in the register 811 to the row main decoder 200. Then, the corresponding block (the first block in this embodiment) is selected, and the verify operation is made for the respective memory cells in the block. The verify operation has been already explained, and therefore the detailed description thereof is omitted herein. Successively, after the signal Φ91 changes to "L", the signal Φ92 changes to "H", so that the internal block address in the register 812 is outputted to the row main decoder 200. Then, the corresponding block (the third block in this embodiment) is selected and the verify operation is made for the respective memory cells.

In the above description, the case where the number of the registers is eight has been explained. Without being limited thereto, the number of the registers is any given number. The number of the registers is determined under consideration of the balance with the chip size according to the number of the blocks. Further, the case where the number of the registers is eight and the number of the erase block is two has been explained. Further, in the above embodiment, the signals Φ91 to Φ98 corresponding to the number of the erased blocks are outputted from a control circuit (not shown). The number of the erased blocks is stored in a counter, for instance.

As described above, in this embodiment, since the internal block addresses of the erased blocks are stored in the registers, it is unnecessary to check the addresses of the erased blocks by scanning the block addresses beginning from the head address in sequence, so that it is possible to reduce the erasure time including the verify operation.

An eighth embodiment will be described hereinbelow, by which it is unnecessary to check the addresses of the erased blocks by scanning the block addresses beginning from the head address in sequence at the verify operation in the same way as with the case of the seventh embodiment.

Figure 27:
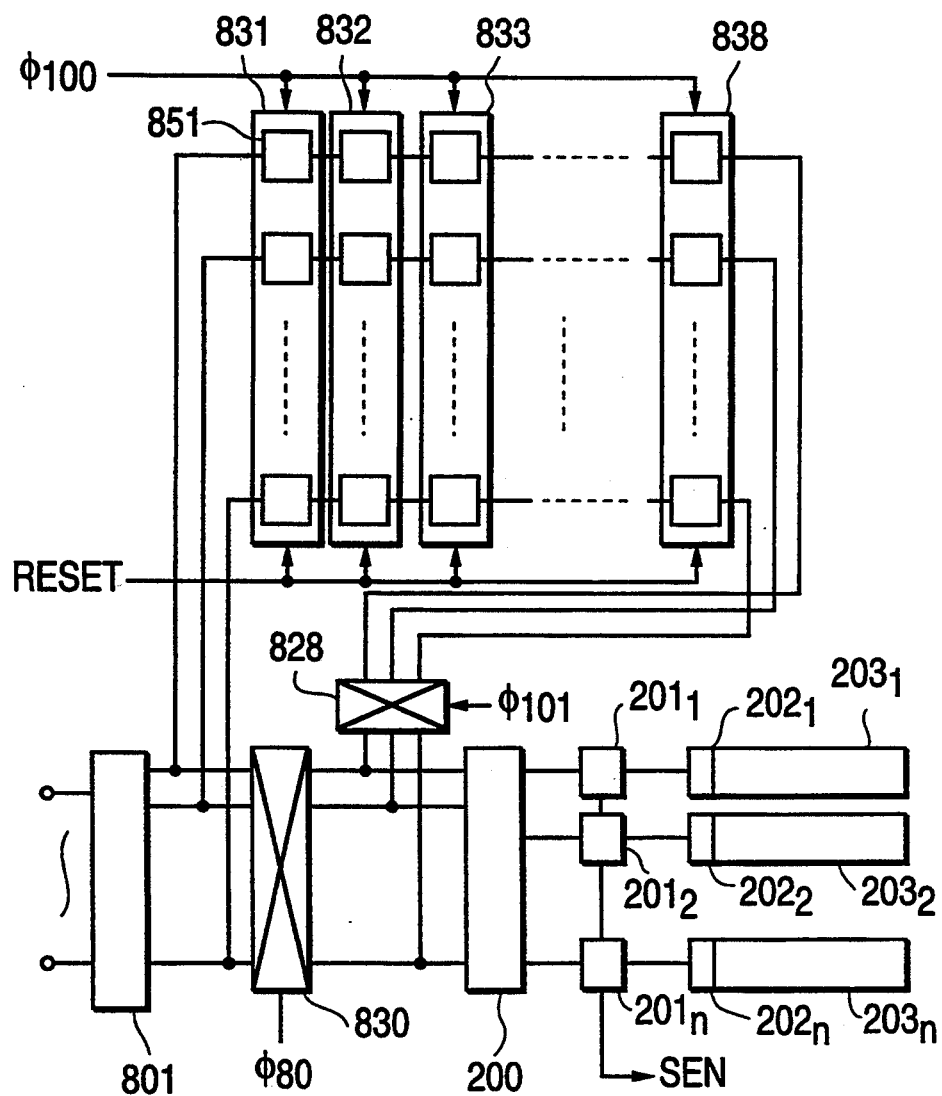
FIG. 27 is a circuit diagram showing an eighth embodiment of the present invention.

FIG. 27 shows a circuit configuration of the eighth embodiment composed of registers 831 to 838 for storing the internal block addresses. In FIG. 27, the same reference numerals have been retained for the similar elements which have the same functions as with the case of the seventh embodiment, without repeating the detailed description thereof.

Figure 28:
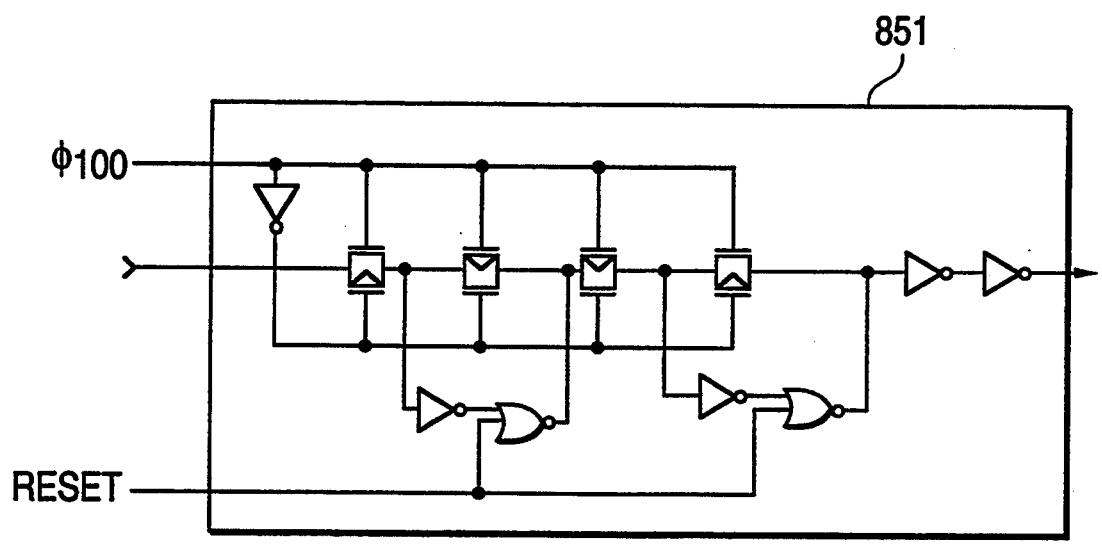
FIG. 28 is a circuit diagram showing an eighth embodiment of the present invention.

The registers 831 to 838 are connected to each other, and each register includes shift registers 851 connected in series so as to correspond to each bit. Therefore, the internal addresses are transferred to the registers 831, 832, 833 ... in sequence. The read operation is effected by shifting the data in the direction of the register 838, so as to function as a FIFO buffer substantially. FIG. 28 shows the detailed configuration of the shift register 851.

The operation of the eighth embodiment will be described hereinbelow. In the same way as in the first embodiment, the main operation is composed of the simultaneous erasure of the plural blocks and the verify operation for the erased blocks. When the erase information is held by the latch circuit 201, the signal Φ80 is at "H", so that the external address latch circuit 801 is connected to the row main decoder 200. Further, at the same time, the internal block addresses are latched by the registers 831 to 838. Here, the first and third blocks are erased simultaneously. When the internal address AI is 000H corresponding to the first block, the row main decoder 200 selects an output node corresponding to the first block, so that the erase information is held by the corresponding latch circuit 201. During this time, the pulse signal Φ100 changes to "H", so that the block address 000H is stored in the register 831. Thereafter, since the internal address AI becomes 002H corresponding to the third block, the row main decoder 200 selects an output node corresponding to the third block, so that the erase information is held by the corresponding latch circuit 201. During this time, the pulse signal Φ100 changes to "H" again, so that the data (000H) of the register 831 is stored in the register 832 and the block address 002H is stored in the register 831.

Thereafter, the batch erasure is made, so that only the blocks whose erase information data are held by the corresponding latch circuits 201 are erased. That is, the first and third blocks are erased.

Successively, a verify is made to check whether the erasure is made securely. In more detail, after the address latch circuit 801 is disconnected from the row main decoder 200 by changing the signal Φ80 to "L", the signal Φ101 is changed to "H", to output the internal block address in the register 838 to the row main decoder 200. However, since the data is nil data, the row main decoder 200 selects no block. Successively, the pulse signal Φ100 is repeatedly outputted until the signal SEN changes to "H" (i.e., until a match signal is detected) to shift the latch data in sequence. The verify operation is made for only the blocks of "H". The verify operation has been already explained and therefore the description is omitted herein. In the same way, the pulse signal Φ100 is outputted for verify operation for the corresponding blocks.

As described above, in this embodiment, since the internal block addresses of the erased blocks are stored in the registers, it is unnecessary to check the addresses of the erased blocks by scanning the block addresses beginning from the head address in sequence, so that it is possible to reduce the erasure time including the verify operation.

In the seventh and eighth embodiments, the number of the registers is eight. Without being limited thereto, any plural numbers of the registers are available. The number of the registers is determined under consideration of the chip size and the number of the blocks to be erased simultaneously.

In the above first to eighth embodiments, the flash EEPROM of NAND type has been described. However, the present invention can be applied to any types of flash EEPROMs by which blocks are erased selectively on the basis of the potential of the control gates, irrespective of the types of logical gates (NAND or NOR) and further of voltages (0 V or negative voltage) applied to the gates in the erasure operation.

The present invention can provide a nonvolatile semiconductor memory device of short erase time.

What is claimed is:

1. A nonvolatile semiconductor memory device, comprising:
    a plurality of batch erase blocks each composed of a plurality of simultaneously erasable nonvolatile memory cells;
    block selecting means for selecting one of a plurality of said batch erase blocks and for outputting a block select signal to a node corresponding to each of the batch erase blocks;
    a plurality of erase information holding means provided for each of the batch erase blocks, for holding erase information of each of the batch erase blocks and for transmitting the block select signal to the corresponding batch erase block in a read operation;
    erase information inputting means for allowing the erase information to be held by said erase information holding means corresponding to said batch erase block selected by said block selecting means; and
    a plurality of memory cell selecting means provided for each of said batch erase blocks, for selecting the nonvolatile memory cells in the corresponding batch erase block in response to the block select signal on the node in the read operation, and for erasing all the nonvolatile memory cells of the corresponding batch erase blocks when the erase information is held by said corresponding erase information holding means in erasure operation.

2. The nonvolatile semiconductor memory device according to claim 1, wherein each of said batch erase blocks has a plurality of NAND bundles arranged in a row direction and wherein said memory cell selecting means provides a low voltage control gate signal for selecting a memory cell of each of said NAND bundles and provides a high voltage control gate signal to other memory cells of said NAND bundles in said read operation.

3. The nonvolatile semiconductor memory device according to claim 1, wherein said memory cell selecting means applies an erase voltage to control electrodes of each of the memory cells in the batch erase blocks whenever the erase information is held by said corresponding erase information holding means in an erasure operation.

4. A nonvolatile semiconductor memory device, comprising:

a plurality of batch erase blocks each composed of a plurality of simultaneously erasable nonvolatile memory cells;

a plurality of decoding means provided for each of the batch erase blocks, each decoding means outputting a decoded signal in response to internal address signals;

a plurality of erase information holding means provided for each of the batch erase blocks, each erase information holding means holding binary data corresponding to erase information of each of the batch erase blocks and outputting an erase signal corresponding to said binary data;

erase information inputting means for allowing the erase information to be held by said erase information holding means in a sequence;

a plurality of signal selecting means provided for each of the batch erase blocks, each signal selecting means transmitting said decoded signal from said decoding means to an output terminal in a read operation and transmitting said erase signal from said erase information holding means to said output terminal in an erasure operation; and a plurality of memory cell selecting means provided for each of said batch erase blocks, for selecting the nonvolatile memory cells in the corresponding batch erase block in response to the signal on said output terminal in the read operation, and for erasing the nonvolatile memory cells in the corresponding batch erase blocks in response to the signal on said output terminal in the erasure operation.

5. The nonvolatile semiconductor memory device according to claim 4, wherein each of said erase information holding means includes latch means and switching means, either one of said switching means selected by said decoding means transmitting erase data stored in said latch means corresponding to said selected switching means.

6. The nonvolatile semiconductor memory device according to claim 5, wherein said erase information inputting means generating said erase data on an erase data input line commonly connected to said switching means.

7. The nonvolatile semiconductor memory device according to claim 6, which further comprises erase binary data outputting means for outputting contents of said erase information holding means on said erase data input line.

8. The nonvolatile semiconductor memory device according to claim 4, wherein said each of said plurality of erase information holding means includes latch means and switching means, either one of said switching means transmitting said decoded signal from said corresponding decoding means to said corresponding latch means.

9. The nonvolatile semiconductor memory device according to claim 8, which further comprises erase binary data outputting means for outputting contents of said erase information holding means on an erase data output line.

10. A nonvolatile semiconductor memory device, comprising:

a plurality of batch erase blocks each composed of a plurality of simultaneously erasable nonvolatile memory cells;

a plurality of erase information holding means provided for each of the batch erase blocks, for holding erase information of each of the batch erase blocks;

erase information inputting means for allowing the erase information to be held by said erase information holding means;

a plurality of erasing means provided for each of said batch erase blocks, for applying an erase voltage to a control electrode of each of the nonvolatile memory cells of the corresponding batch erase block, whenever the erase information is held by said corresponding erase information holding means in an erasure operation; and erase information reading means for outputting erase information data of selected one of said erase information holding means on a common line connected to said erase information holding means.

11. The nonvolatile semiconductor memory device according to claim 10, which further comprises erase verify operation control means for selectively accomplishing an erase verify read operation for memory cells in erased batch erase blocks in response to said erase information data.

12. A nonvolatile semiconductor memory device, comprising:

a plurality of batch erase blocks each composed of a plurality of simultaneously erasable nonvolatile memory cells;

a plurality of erase information holding means provided for each of the batch erase blocks, for holding erase information of each of the batch erase blocks;

erase information inputting means for allowing the erase information to be held by said erase information holding means;

a plurality of erasing means provided for each of said batch erase blocks, for applying an erase voltage to each of the nonvolatile memory cells of the corresponding batch erase block, whenever the erase information is held by said corresponding erase information holding means in an erasure operation; and erase verify operation control means for providing a selective erase verify operation for only memory cells in erased batch erase blocks in response to said erase information with following sequential functions:

an erased block searching function of searching an erased batch erase block address by reading said erase information from said erase information holding means and setting an internal address for said erased batch erase block address, and an erase verify function of reading memory cells data in the batch erase block designated by said internal address and generating a pass-fail signal in response to said read out memory cells data, if said pass-fail signal shows an unsuccessful erase operation, performing a re-erase operation and if said pass-fail signal shows successful erase operation, performing a next erased block searching operation.

13. A nonvolatile semiconductor memory device, comprising:

a plurality of batch erase blocks each composed of a a plurality of batch erase blocks each composed of a plurality of simultaneously erasable nonvolatile memory device;

a plurality of erase information holding means provided for each of the batch erase blocks, for holding erase information of each of the batch erase blocks;

erase information inputting means for allowing the erase information to be held by said erase information holding means;

a plurality of erasing means provided for each of said batch erase blocks, for applying an erase voltage to each of the nonvolatile memory cells in the selected batch erase block in which the erase information is held by said corresponding erase information holding means in an erasure operation; and erase operation control means for checking memory cell data in the selected batch erase blocks having has the erase information held in said corresponding erase information holding means with following sequential functions:

an erase verify function of searching the address of said selected batch erase blocks by reading the erase information from said each erase information holding means and reading said memory cell data in said selected batch erase blocks, if erase successful memory cell data is read out from a pre-determined number of said selected batch erase blocks, changing the erase information in erase information holding means in the batch erase blocks, having only erase successful memory cells, and a re-erase function of erasing memory cells in the batch erase blocks having an erase unsuccessful memory cell.

* * * * *